(12) United States Patent
Ogata et al.

(10) Patent No.: US 12,332,566 B2
(45) Date of Patent: Jun. 17, 2025

(54) RESIST UNDERLAYER FILM-FORMING COMPOSITION

(71) Applicant: NISSAN CHEMICAL CORPORATION, Tokyo (JP)

(72) Inventors: Hiroto Ogata, Toyama (JP); Tomotada Hirohara, Toyama (JP); Keisuke Hashimoto, Toyama (JP); Makoto Nakajima, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/264,542

(22) PCT Filed: Jul. 18, 2019

(86) PCT No.: PCT/JP2019/028273
§ 371 (c)(1),
(2) Date: Jan. 29, 2021

(87) PCT Pub. No.: WO2020/026834
PCT Pub. Date: Feb. 6, 2020

(65) Prior Publication Data
US 2021/0311396 A1    Oct. 7, 2021

(30) Foreign Application Priority Data
Jul. 31, 2018 (JP) ................................. 2018-144180

(51) Int. Cl.
| | |
|---|---|
| G03F 7/11 | (2006.01) |
| C08G 59/22 | (2006.01) |
| C08G 59/24 | (2006.01) |
| C08G 59/42 | (2006.01) |
| C08G 59/68 | (2006.01) |
| C08G 63/42 | (2006.01) |
| C09D 163/00 | (2006.01) |
| G03F 7/09 | (2006.01) |

(52) U.S. Cl.
CPC .............. *G03F 7/11* (2013.01); *C08G 59/245* (2013.01); *C08G 59/4207* (2013.01); *C08G 59/4215* (2013.01); *C08G 59/688* (2013.01); *C09D 163/00* (2013.01)

(58) Field of Classification Search
None
See application file for complete search history.

(56) References Cited

U.S. PATENT DOCUMENTS

| | | | | |
|---|---|---|---|---|
| 5,852,163 A | * | 12/1998 | Chen ....................... | C08G 63/42 528/274 |
| 6,074,758 A | * | 6/2000 | Barbee .................. | B32B 27/285 525/437 |
| 2003/0180559 A1 | | 9/2003 | Wayton et al. | |
| 2008/0032231 A1 | | 2/2008 | Hatakeyama et al. | |
| 2009/0317740 A1 | * | 12/2009 | Hiroi ................... | C08G 63/6856 430/270.1 |
| 2010/0009293 A1 | | 1/2010 | Yao et al. | |
| 2010/0092894 A1 | | 4/2010 | Liu et al. | |
| 2010/0221657 A1 | | 9/2010 | Sakamoto et al. | |
| 2013/0171569 A1 | | 7/2013 | Tachibana et al. | |
| 2015/0017791 A1 | * | 1/2015 | Ohashi ................ | H01J 37/3171 438/514 |
| 2016/0186006 A1 | * | 6/2016 | Ohnishi ................. | C08G 59/42 523/400 |
| 2016/0222248 A1 | * | 8/2016 | Endo .................... | C09D 145/00 |
| 2017/0038687 A1 | | 2/2017 | Ogata et al. | |
| 2017/0153547 A1 | | 6/2017 | Sim et al. | |
| 2017/0250079 A1 | | 8/2017 | Nishita et al. | |
| 2018/0081274 A1 | | 3/2018 | Ogata et al. | |
| 2018/0138034 A1 | | 5/2018 | Lin et al. | |
| 2018/0305578 A1 | * | 10/2018 | Sakaguchi ............. | C08G 59/14 |
| 2020/0201184 A1 | | 6/2020 | Ogata et al. | |

(Continued)

FOREIGN PATENT DOCUMENTS

| | | |
|---|---|---|
| CN | 101473270 A | 7/2009 |
| CN | 105849642 A | 8/2016 |
| CN | 107111234 A | 8/2017 |

(Continued)

OTHER PUBLICATIONS

Oct. 8, 2019 International Search Report issued in International Patent Application No. PCT/JP2019/028273.
Oct. 8, 2019 Written Opinion of the International Searching Authority issued in International Patent Application No. PCT/JP2019/028273.
Mar. 29, 2023 Office Action issued in Taiwanese Patent Application No. TW 108126877.
Jan. 16, 2024 Office Action issued in Korean Patent Application No. 10-2021-7001072.
Jun. 28, 2023 Notice of Reasons for Refusal issued in Japanese Patent Application No. 2020-533418.

(Continued)

*Primary Examiner* — Ha S Nguyen
(74) *Attorney, Agent, or Firm* — Oliff PLC

(57) ABSTRACT

A resist underlayer film-forming composition including: a resin having a repeating structural unit including at least one —C(=O)—O— group in a main chain and a repeating structural unit including at least one hydroxy group in a side chain, or including at least one —C(=O)—O— group in a main chain and at least one hydroxy group in a side chain, wherein none of these units have an organic group containing an epoxy or oxetane ring; an acid catalyst or salt thereof in an amount of 0.1 to 10 parts by mass relative to 100 parts by mass of the resin, when the catalyst is a monovalent acid, an acid dissociation constant pKa is −0.5 or less in 25° C. water, or when a multivalent acid, an acid dissociation constant $pKa_1$ is −0.5 or less in 25° C. water; and a solvent, wherein the composition does not include a monomer crosslinking agent.

10 Claims, No Drawings

(56) References Cited

U.S. PATENT DOCUMENTS

2021/0063881 A1    3/2021  Endo et al.

FOREIGN PATENT DOCUMENTS

| | | | |
|---|---|---|---|
| JP | 2003-233195 A | 8/2003 | |
| JP | 2008-039815 A | 2/2008 | |
| JP | 2009093162 A * | 4/2009 | |
| JP | 2011-527460 A | 10/2011 | |
| JP | 2012-505434 A | 3/2012 | |
| JP | 2013-156627 A | 8/2013 | |
| JP | 2017-107185 A | 6/2017 | |
| WO | 2009/057458 A1 | 5/2009 | |
| WO | 2011/004721 A1 | 1/2011 | |
| WO | 2016/158509 A1 | 10/2016 | |
| WO | WO-2017064992 A1 * | 4/2017 | ........... B05D 3/0254 |
| WO | 2018/203540 A1 | 11/2018 | |
| WO | 2019/151471 A1 | 8/2019 | |

Mar. 21, 2024 Office Action issued in Taiwanese Patent Application No. 108126877.
Jan. 11, 2024 Office Action issued in Chinese Patent Application No. 201980050814.7.

* cited by examiner

RESIST UNDERLAYER FILM-FORMING COMPOSITION

TECHNICAL FIELD

The present invention relates to a resist underlayer film-forming composition for forming a resist underlayer film for lithography that can be used as an anti-reflective coating during light exposure, and can also be suitably used as a planarization film for filling recesses or stepped portions to achieve planarity.

BACKGROUND ART

Fine processing by lithography using a photoresist composition has been performed in the production of semiconductor devices. In recent years, active rays having a shorter wavelength have tended to be used (i.e., shifting from KrF excimer laser (248 nm) to ArF excimer laser (193 nm)) in association with an increase in the degree of integration of semiconductor devices.

However, KrF excimer laser or ArF excimer laser incident on a resist film (incident light) before formation of a resist pattern is reflected on the surface of a substrate, to thereby generate a standing wave in the resist film. This standing wave may lead to deformation of a pattern edge, resulting in failure to form a resist pattern having a desired shape. Thus, the presence of such a standing wave is known to cause a change in the dimensions of a resist pattern and poor resolution.

There have been disclosed, for example, an underlayer film-forming composition for lithography containing a linear polymer having 2,4-dihydroxybenzoic acid introduced into the main chain, and a solvent (see Patent Document 1); and a resist underlayer film-forming composition for lithography containing a polymer having a benzaldehyde or naphthaldehyde structure introduced into the main chain via an ester or ether structure, a sulfonic acid compound, and a solvent (see Patent Document 2).

A resist underlayer film formed from such a composition has been shown to function as an anti-reflective coating, and to enable formation of a rectangular resist pattern even when ArF excimer laser is used as a light source.

In association with a tendency of a fine pattern rule for semiconductor devices, a dual damascene process has been studied as a method for forming wiring on a semiconductor substrate in order to solve a problem of wiring delay in the semiconductor devices. In general, a substrate used for the process has recesses or stepped portions, such as holes or a trench structure. Thus, the production of a semiconductor device having a fine design rule requires a resist underlayer film that enables filling recesses and formation of a flat and even coating film on the substrate having the recesses or stepped portions. However, Patent Documents 1 and 2 do not disclose the planarity of a resist underlayer film (anti-reflective coating).

There has been disclosed, for example, a resist underlayer film-forming composition for lithography containing an alicyclic epoxy compound having a light-absorbing moiety such as a benzene ring, a thermal acid generator for promoting a crosslinking reaction, and a solvent (see Patent Document 3). According to the patent document, the composition can form a resist underlayer film capable of filling irregularities of a substrate having holes for planarization.

There has also been disclosed a resist underlayer film composition containing a crosslinkable polymer, and an amine salt of an α-difluorosulfonic acid serving as a thermal acid generator (Patent Document 4). According to the patent document, the use of this composition enables formation of a resist pattern having no skirt-shaped cross section.

PRIOR ART DOCUMENTS

Patent Documents

Patent Document 1: International Publication WO 2009/057458
Patent Document 2: International Publication WO 2011/004721
Patent Document 3: International Publication WO 2016/158509
Patent Document 4: Japanese Unexamined Patent Application Publication No. 2008-039815 (JP 2008-039815 A)

SUMMARY OF THE INVENTION

Problems to be Solved by the Invention

In view of the aforementioned problems, an object of the present invention is to provide a resist underlayer film-forming composition that can be used for the production of a semiconductor device. Specifically, an object of the present invention is to provide a resist underlayer film-forming composition for forming a resist underlayer film that has solvent resistance and does not cause intermixing with a photoresist layer applied and formed above the resist underlayer film.

In particular, an object of the present invention is to provide a resist underlayer film-forming composition for forming a resist underlayer film that can be suitably used as an anti-reflective coating for reducing the reflection of exposure light from a substrate onto a resist layer, and can be suitably used as a planarization film for planarizing a semiconductor substrate having recesses or stepped portions, in a lithographic process for the production of a semiconductor device.

Means for Solving the Problems

A first aspect of the present invention is a resist underlayer film-forming composition comprising a resin having a repeating structural unit including at least one —C(=O)—O— group in a main chain and a repeating structural unit including at least one hydroxy group in a side chain, or having a repeating structural unit including at least one —C(=O)—O— group in a main chain and including at least one hydroxy group in a side chain, wherein none of these repeating structural units have an organic group containing an epoxy ring or an oxetane ring; an acid catalyst or a salt thereof in an amount of 0.1 parts by mass to 10 parts by mass relative to 100 parts by mass of the resin, wherein, when the acid catalyst is a monovalent acid, an acid dissociation constant pKa is −0.5 or less in water at 25° C., or when the acid catalyst is a multivalent acid, an acid dissociation constant $pKa_1$ is −0.5 or less in water at 25° C.; and a solvent, wherein the resist underlayer film-forming composition does not comprise a crosslinking agent in the form of a monomer.

The salt of the acid catalyst is, for example, a trifluoromethanesulfonic acid salt.

The cationic component of the trifluoromethanesulfonic acid salt is, for example, a primary to quaternary ammonium ion, a pyridinium ion optionally having a substituent, an imidazolium ion optionally having a substituent, an iodonium ion optionally having a substituent, a sulfonium ion optionally having a substituent, or a pyrylium ion optionally having a substituent.

The resin is, for example, a copolymer having a repeating structural unit of the following Formula (1-1) and a repeating structural unit of the following Formula (1-2):

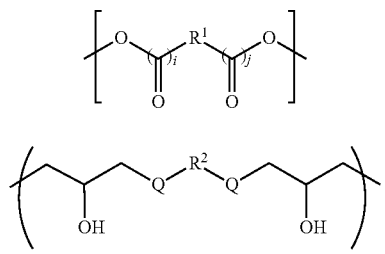

(wherein $R^1$ and $R^2$ are each independently a divalent organic group containing a linear, branched, or cyclic functional group having a carbon atom number of 2 to 20; the organic group optionally has at least one sulfur atom, nitrogen atom, or oxygen atom; i and j are each independently 0 or 1; two Qs are each a single bond, an —O— group, or a —C(=O)—O— group; and, when both i and j are 0, at least one Q of two Qs is a —C(=O)—O— group).

In the repeating structural unit of Formula (1-1), $R^1$ is, for example, a divalent linear, branched, or cyclic hydrocarbon group having a carbon atom number of 2 to 20, a divalent linear, branched, or cyclic organic group having a carbon atom number of 2 to 20 and at least one sulfur atom or oxygen atom, or a divalent organic group containing at least one $C_{6-20}$ aromatic ring or $C_{3-12}$ heterocyclic ring, and the heterocyclic ring has at least one sulfur atom or oxygen atom.

In the repeating structural unit of Formula (1-2), $R^2$ is, for example, a divalent linear, branched, or cyclic hydrocarbon group having a carbon atom number of 2 to 20, or a divalent organic group containing at least one $C_{6-20}$ aromatic ring or $C_{3-12}$ heterocyclic ring, and the heterocyclic ring has at least one sulfur atom or oxygen atom.

The resist underlayer film-forming composition of the present invention may further comprise a compound of the following Formula (2), (3), or (4):

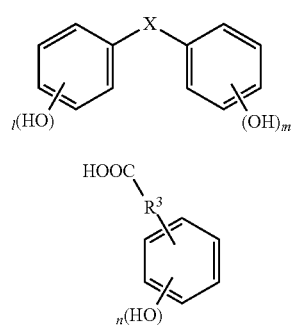

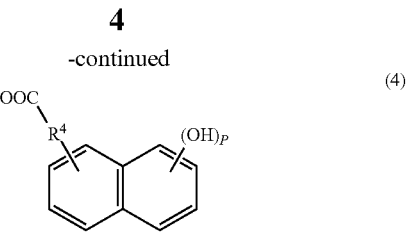

(wherein X is a carbonyl or methylene group; l and m are each independently an integer of 0 to 5 so as to satisfy a relation of $3 \leq l+m \leq 10$; $R^3$ and $R^4$ are each independently a $C_{1-4}$ alkylene or alkenylene group or a single bond; n and p are each independently an integer of 2 to 4; and each substituent in Formula (4) is located at any of positions 1 to 8 of the naphthalene ring).

The resist underlayer film-forming composition of the present invention may further comprise a surfactant.

Effects of the Invention

The present invention can provide a resist underlayer film-forming composition for forming a resist underlayer film that has solvent resistance and does not cause intermixing with a photoresist layer applied and formed above the resist underlayer film.

Since the resist underlayer film-forming composition of the present invention does not contain a low-molecular-weight compound such as a crosslinking agent, the amount of sublimates can be reduced during baking of the composition, and the interiors of recesses can be sufficiently filled with the composition without occurrence of voids (gaps). Thus, the present invention can provide a resist underlayer film-forming composition for forming a resist underlayer film that can planarize a substrate having recesses or stepped portions.

Also, the present invention can provide a resist underlayer film-forming composition for forming a resist underlayer film that can be suitably used as an anti-reflective coating for reducing the reflection of exposure light from a substrate onto a resist layer.

MODES FOR CARRYING OUT THE INVENTION

The resist underlayer film-forming composition of the present invention contains a resin, a specific amount of an acid catalyst or a salt thereof exhibiting an acid dissociation constant pKa or $pKa_1$ of −0.5 or less in water at 25° C., and a solvent. Thus, the composition, which does not contain a crosslinking agent in the form of a monomer, can form a resist underlayer film through curing. The term "monomer" as used herein refers to a monomer having no repeating unit, and does not correspond to a polymer and oligomer prepared by polymerization of a plurality of monomers. The resist underlayer film-forming composition of the present invention, which contains such an acid catalyst, can form a resist underlayer film exhibiting superior planarity on a semiconductor substrate having recesses or stepped portions.

Examples of the crosslinking agent in the form of a monomer, which is not contained in the resist underlayer film-forming composition of the present invention, include a melamine compound, a guanamine compound, a glycoluril compound, a urea compound, and an aromatic compound, wherein each compound contains at least one group selected from a methylol group, an alkoxymethyl group, and an acyloxymethyl group (two or more groups in one molecule);

and an epoxy compound, an oxetane compound, an isocyanate compound, a blocked isocyanate compound, an azide compound, an alkenyl ether compound, an acrylic compound, and a methacrylic compound, wherein each compound contains at least one group selected from an epoxy group, an oxetanyl group, an isocyanate group, a blocked isocyanate group, an azi group, an alkenyl ether group, an acryloyloxy group, and a methacryloyloxy group (two or more groups in one molecule).

In the present specification, the resist underlayer film-forming composition of the present invention is defined as not containing a component whose amount is below the detection limit when the composition is subjected to quantitative analysis.

The components contained in the resist underlayer film-forming composition of the present invention will next be described in detail.

[Acid Catalyst or Salt Thereof]

No particular limitation is imposed on the acid catalyst or the salt thereof, which is an essential component of the resist underlayer film-forming composition of the present invention, so long as when the acid catalyst is a monovalent acid, an acid dissociation constant pKa is −0.5 or less in water at 25° C., or when the acid catalyst is a multivalent acid, an acid dissociation constant $pKa_1$ is −0.5 or less in water at 25° C.

A smaller acid dissociation constant pKa indicates a stronger acid, and is preferred in the present invention. The term "acid dissociation constant pKa" refers to a negative common logarithm of the equilibrium constant Ka of acid ionization equilibrium; i.e., $pKa = -\log_{10} Ka$. When the acid catalyst is a multivalent acid, a plurality of acid equilibrium constants Ka ($Ka_1$, $Ka_2$, $Ka_3$, . . . ) are obtained on the basis of the order of dissociation. In the present invention, the composition contains a selected acid catalyst having a negative common logarithm of the equilibrium constant $Ka_1$ of the first acid ionization equilibrium, namely, an acid dissociation constant $pKa_1$, of −0.5 or less.

Examples of the acid catalyst exhibiting an acid dissociation constant pKa or $pKa_1$ of −0.5 or less include p-toluenesulfonic acid (pKa=−2.8), p-phenolsulfonic acid ($pKa_1$=−2.59), 5-sulfosalicylic acid ($pKa_1$=−2.81), and trifluoromethanesulfonic acid (pKa=−14.0) or salts of these acids.

Examples of the cationic component of such an acid salt include, but are not particularly limited to, cations derived from primary to tertiary aliphatic amines, hybrid amines, aromatic amines, heterocyclic amines, nitrogen-containing compounds having a hydroxyl group, nitrogen-containing compounds having a hydroxyphenyl group, alcoholic nitrogen-containing compounds, quaternary ammonium compounds, iodonium compounds, sulfonium compounds, and pyrane. Preferred are a primary to quaternary ammonium ion, a pyridinium ion optionally having a substituent, an imidazolium ion optionally having a substituent, an iodonium ion optionally having a substituent, a sulfonium ion optionally having a substituent, or a pyrylium ion optionally having a substituent. Examples of the substituent include, but are not particularly limited to, a methyl group, an ethyl group, a propyl group, a butyl group, a fluoro group, a phenyl group, and a benzyl group.

The acid catalyst is particularly preferably a trifluoromethanesulfonic acid salt, and examples thereof include compounds of the following formulae.

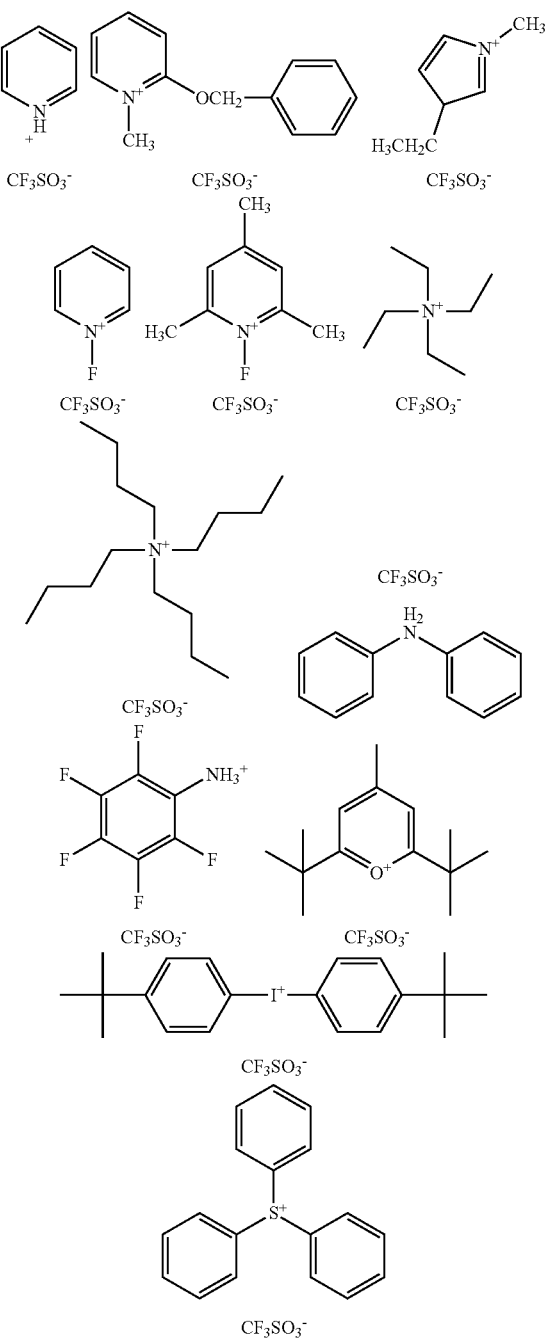

A very small amount of the acid catalyst used in the present invention volatilizes during baking of the resist underlayer film-forming composition for crosslinking of the resin contained in the composition. Since the resist underlayer film-forming composition of the present invention does not contain a low-molecular-weight volatile component such as a crosslinking agent, the amount of sublimates can be reduced during baking of the composition. Thus, the composition can form a planarized resist underlayer film having no gaps (e.g., voids).

The resist underlayer film-forming composition of the present invention contains the aforementioned acid catalyst or the salt thereof in an amount of, for example, 0.1 parts by mass to 10 parts by mass relative to 100 parts by mass of the aforementioned resin. When the amount of the acid catalyst or the salt thereof is less than 0.1 parts by mass relative to 100 parts by mass of the resin, the effects of the present invention may fail to be achieved. When the amount of the acid catalyst or the salt thereof is more than 10 parts by mass relative to 100 parts by mass of the resin, the amount of sublimates may increase during baking of the composition, leading to occurrence of gaps such as voids, resulting in failure to achieve the effects of the present invention.

[Resin]

No particular limitation is imposed on the resin, which is an essential component of the resist underlayer film-forming composition of the present invention, so long as the resin has a repeating structural unit including at least one —C(=O)—O— group in a main chain and a repeating structural unit including at least one hydroxy group in a side chain, or the resin has a repeating structural unit including at least one —C(=O)—O— group in a main chain and including at least one hydroxy group in a side chain, wherein none of these repeating structural units have an organic group containing an epoxy ring or an oxetane ring. Examples of the organic group containing an epoxy ring or an oxetane ring include a glycidyl group and an oxetanyl group. The resin not having the organic group is a resin not having, for example, a glycidyl group or an oxetanyl group. The resin has a weight average molecular weight of, for example, 500 to 50,000, preferably 900 to 50,000.

Since the resin does not have an organic group containing a highly reactive epoxy ring or oxetane ring, the resist underlayer film-forming composition of the present invention exhibits superior storage stability.

The resin, which is an essential component of the resist underlayer film-forming composition of the present invention, is preferably a copolymer having a repeating structural unit of Formula (1-1) and a repeating structural unit of Formula (1-2).

More preferably, $R^1$ in Formula (1-1) is a divalent linear, branched, or cyclic hydrocarbon group having a carbon atom number of 2 to 20, a divalent linear, branched, or cyclic organic group having a carbon atom number of 2 to 20 and at least one sulfur atom or oxygen atom, or a divalent organic group containing at least one $C_{6-20}$ aromatic ring or $C_{3-12}$ heterocyclic ring, and the heterocyclic ring has at least one sulfur atom or oxygen atom.

More preferably, $R^2$ in Formula (1-2) is a divalent linear, branched, or cyclic hydrocarbon group having a carbon atom number of 2 to 20, or a divalent organic group containing at least one $C_{6-20}$ aromatic ring or $C_{3-12}$ heterocyclic ring, and the heterocyclic ring has at least one sulfur atom or oxygen atom.

The aromatic ring and the heterocyclic ring can absorb KrF excimer laser or ArF excimer laser used in a lithographic process. Since a resist underlayer film formed from the resist underlayer film-forming composition of the present invention has at least one aromatic ring or heterocyclic ring in a repeating structural unit of Formula (1-2), the film can be more suitably used as an anti-reflective coating.

Examples of the aforementioned aromatic ring include a benzene ring, a naphthalene ring, an anthracene ring, a phenanthrene ring, a naphthacene ring, a triphenylene ring, a pyrene ring, and a chrysene ring. Preferred are a benzene ring and a naphthalene ring.

Examples of the aforementioned heterocyclic ring include a triazine ring, a cyanuric ring, a pyrimidine ring, an imidazole ring, and a carbazole ring.

The aforementioned copolymer may be a commercially available copolymer or a copolymer synthesized from a commercially available material by a known method.

For example, the resin used in the present invention may be a copolymer of at least one compound of the following Formula (A):

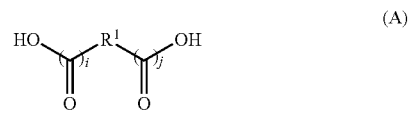

(A)

(wherein $R^1$, i, and j have the same meanings as defined above) with at least one diepoxy compound of the following Formula (B):

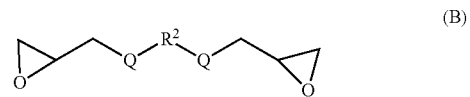

(B)

(wherein $R^2$ and Q have the same meanings as defined above).

Specifically, the copolymer having a repeating structural unit of Formula (1-1) and a repeating structural unit of Formula (1-2) can be prepared by dissolving, in an organic solvent, at least one compound of Formula (A) and at least one diepoxy compound of Formula (B) in appropriate proportions by mole, and polymerizing these compounds optionally in the presence of a catalyst.

Examples of the compound of Formula (A) include, but are not particularly limited to, compounds of the following formulae.

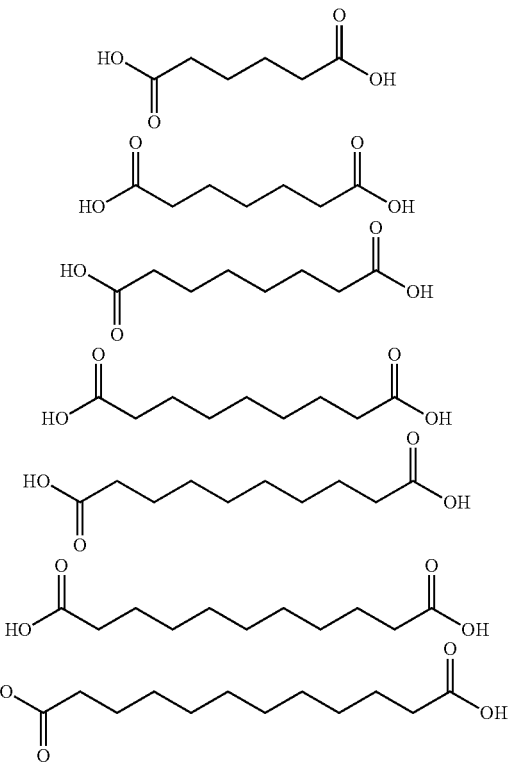

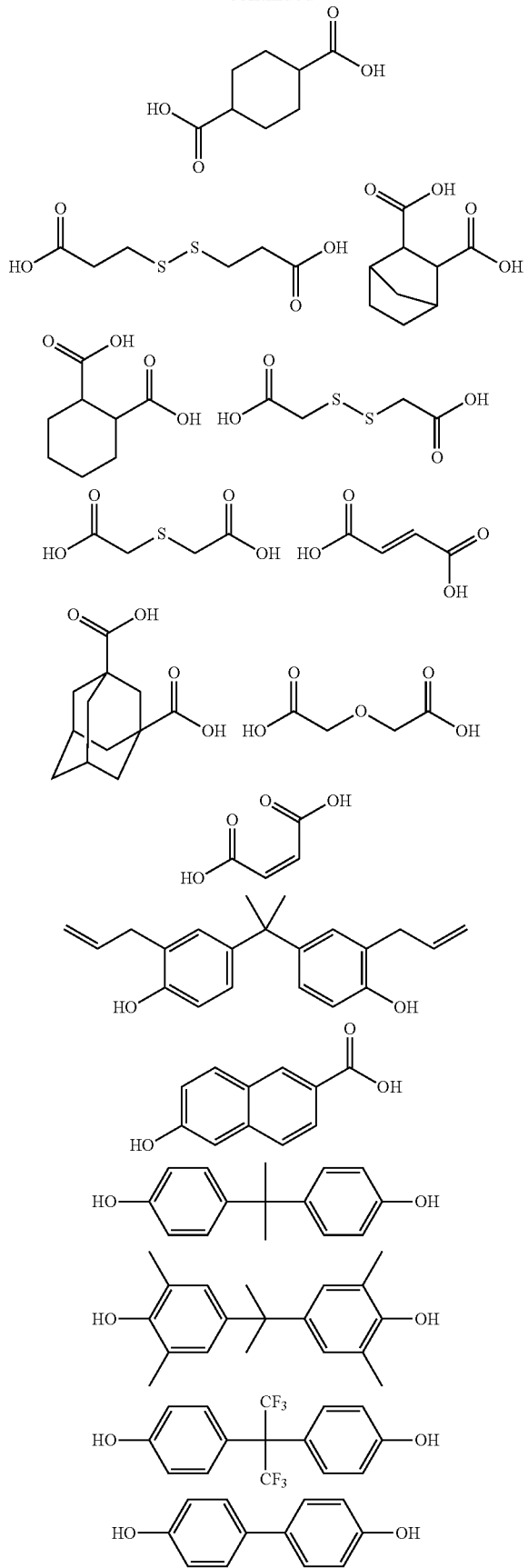
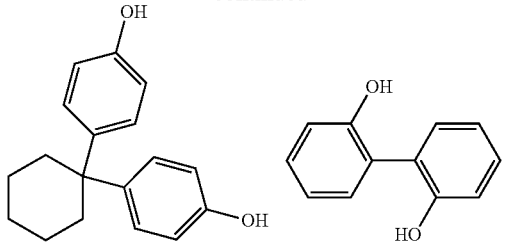
Examples of the diepoxy compound of Formula (B) include, but are not particularly limited to, diepoxy compounds of the following formulae.
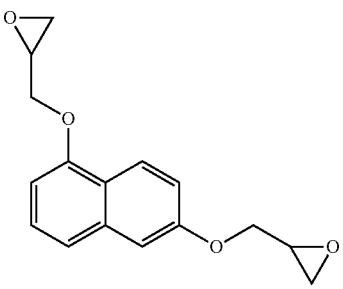
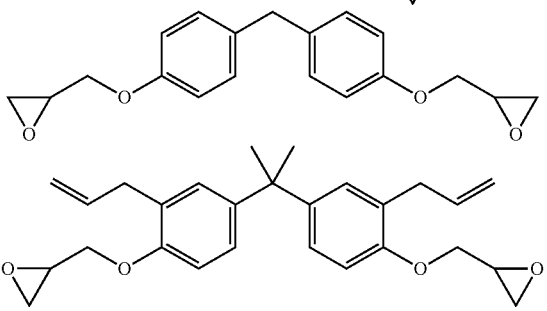
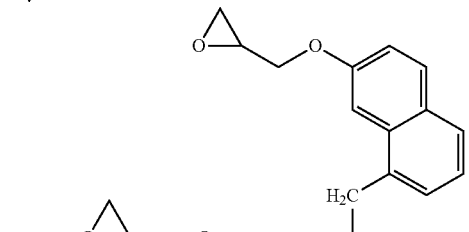
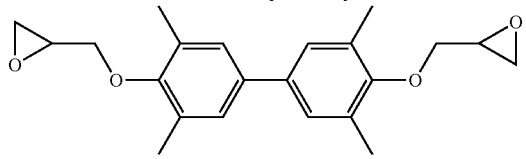
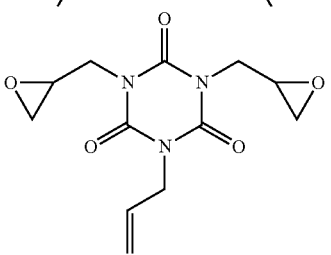

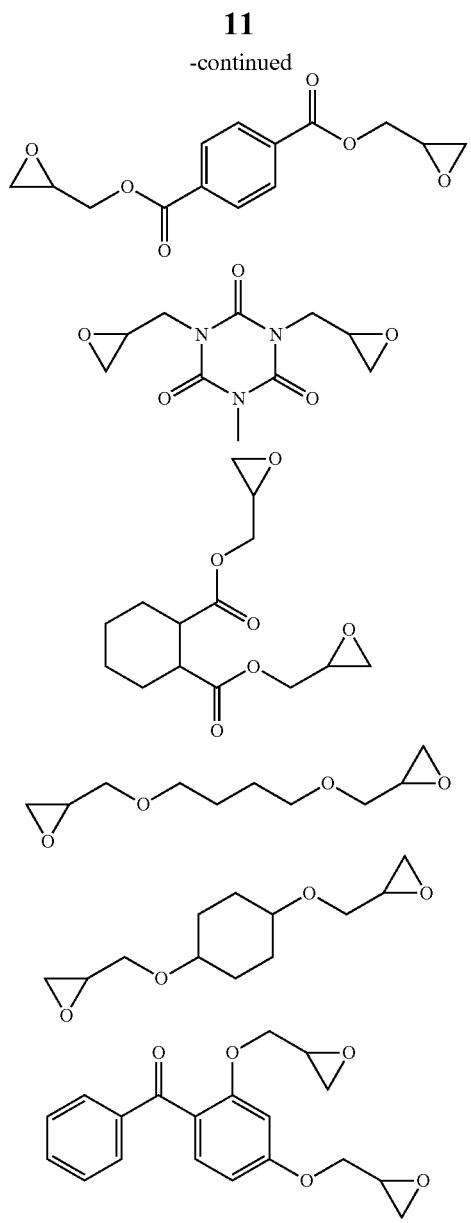
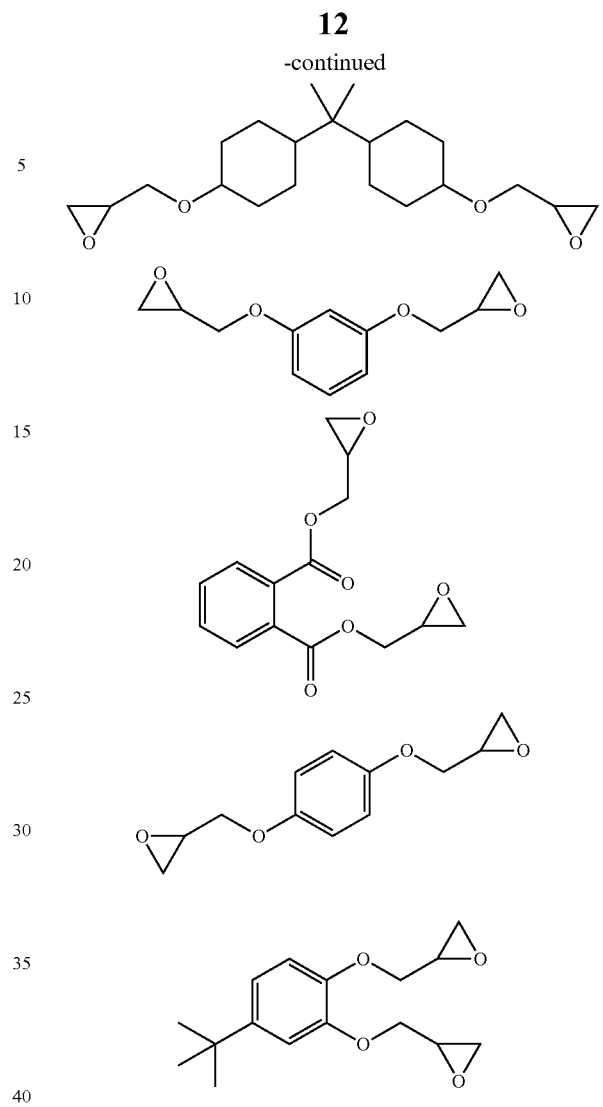
Examples of the copolymer having a repeating structural unit of Formula (1-1) and a repeating structural unit of Formula (1-2) include copolymers having repeating structural units of the following Formulae (1a) to (1n).
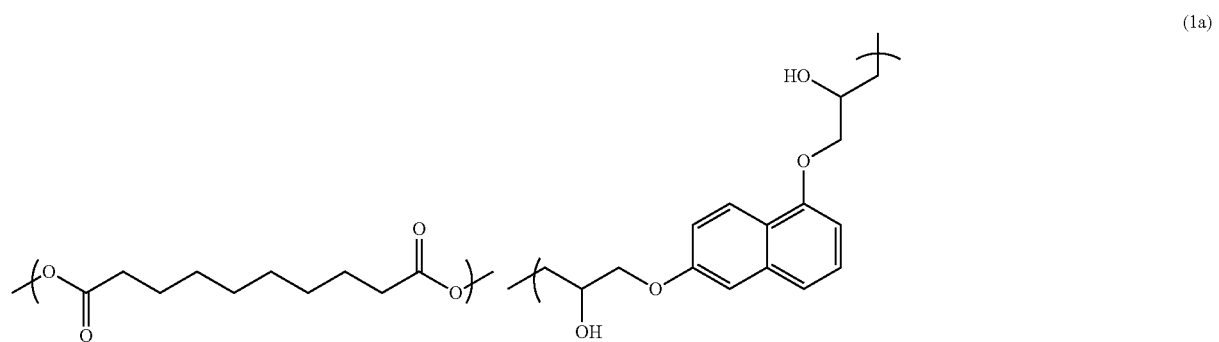
(1a)

-continued
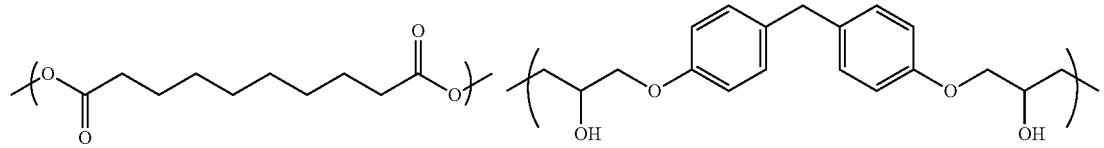
(1b)
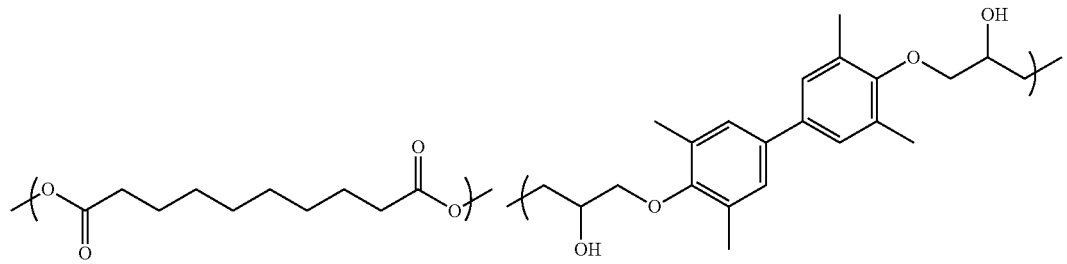
(1c)
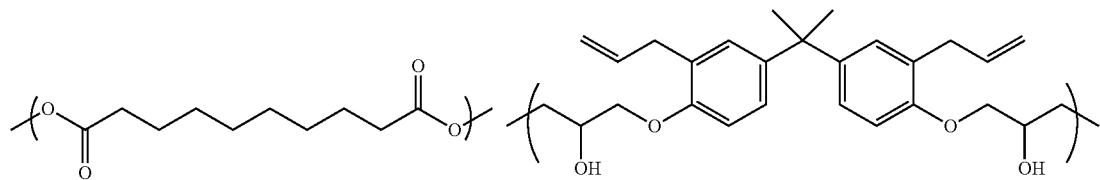
(1d)
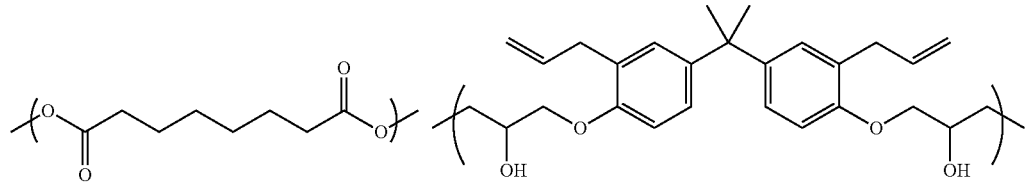
(1e)
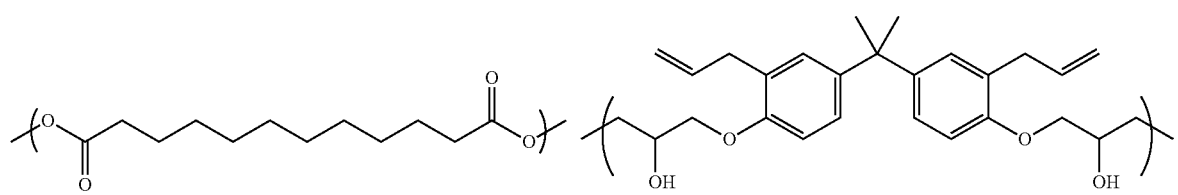
(1f)
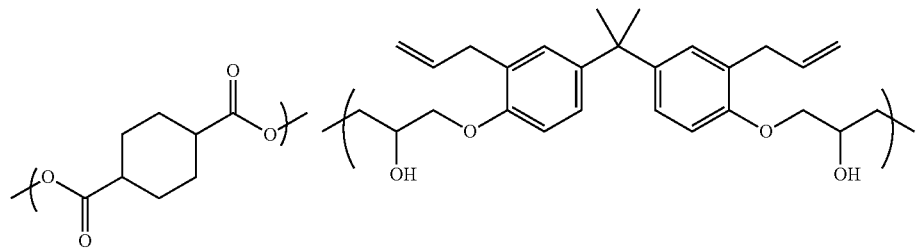
(1g)
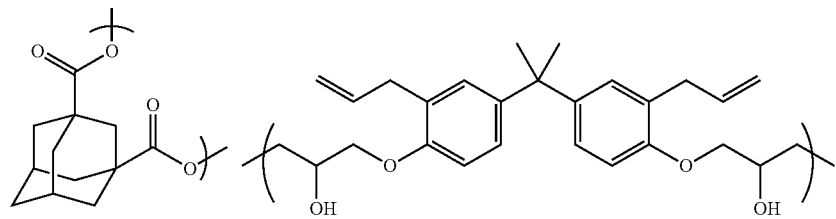
(1h)

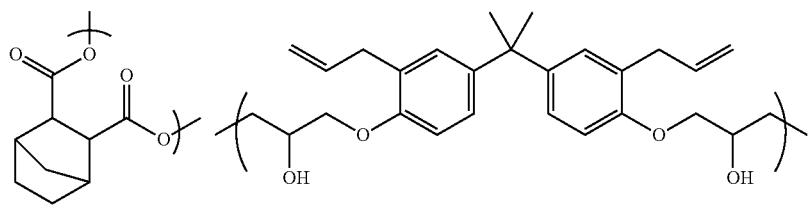
(1i)
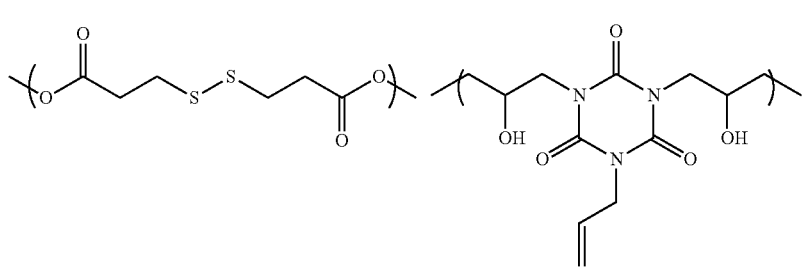
(1j)
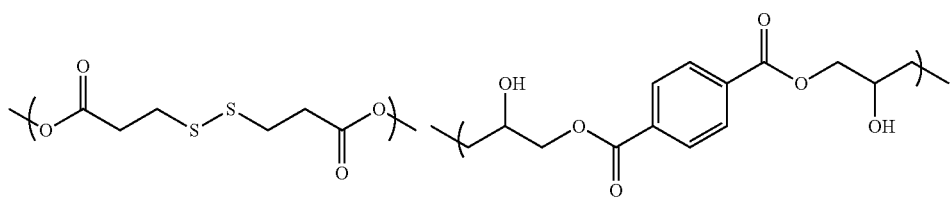
(1k)
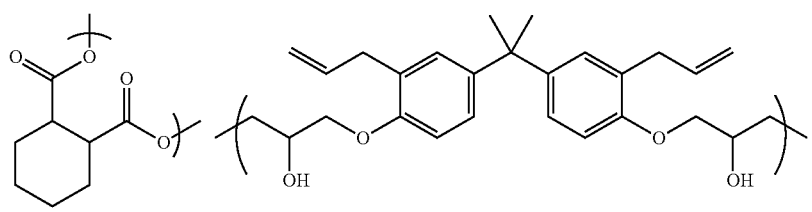
(1l)
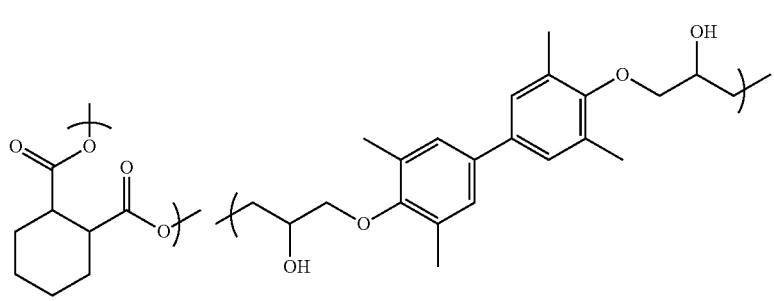
(1m)

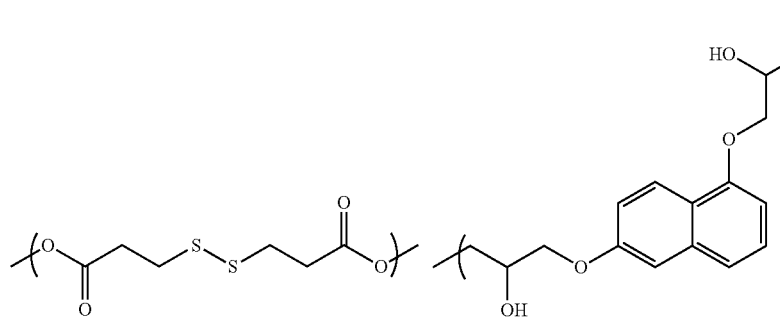
(1n)
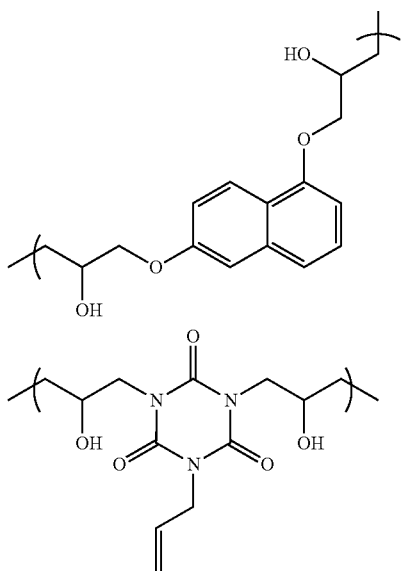
25
[Compound of Formula (2), (3), or (4)]
The resist underlayer film-forming composition of the present invention may contain a compound of Formula (2), (3), or (4) as an optional component. Examples of the compound of Formula (2) include compounds of the following Formulae (2-1) to (2-20).
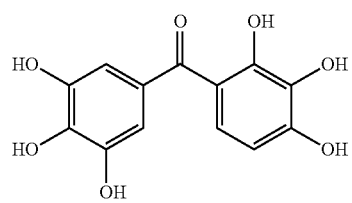
(2-1)
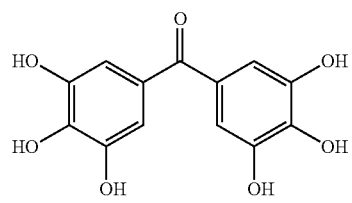
(2-2)
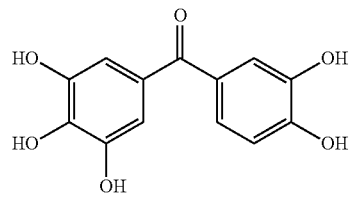
(2-3)
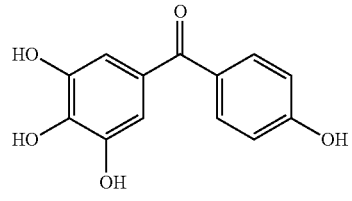
(2-4)
-continued
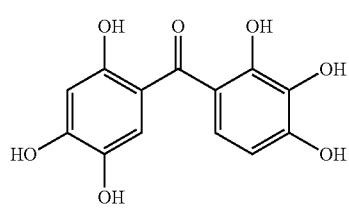
(2-5)
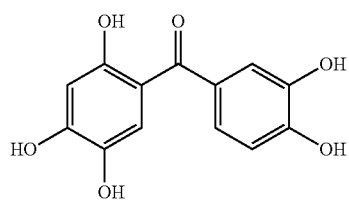
(2-6)
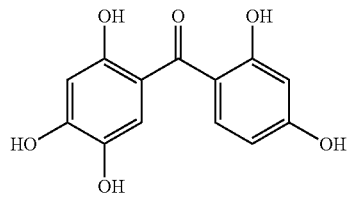
(2-7)
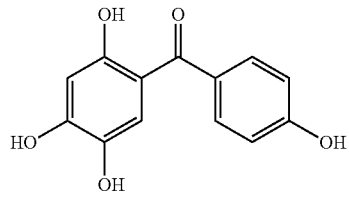
(2-8)
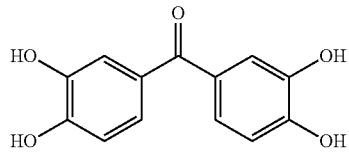
(2-9)

(2-10)
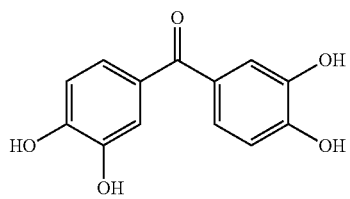
(2-11)
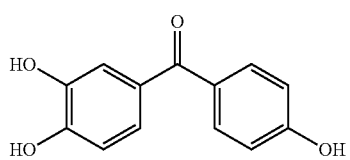
(2-12)
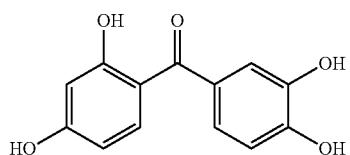
(2-13)
(2-14)
(2-15)
(2-16)
(2-17)
(2-18)
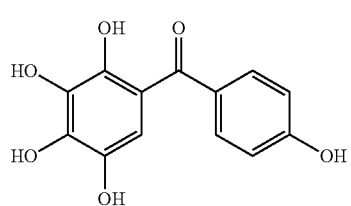
(2-19)
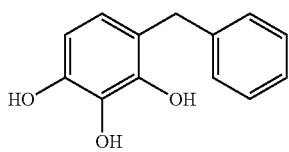
(2-20)
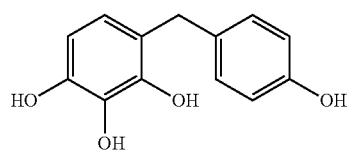
Examples of the compound of Formula (3) include compounds of the following Formulae (3-1) to (3-22).
(3-1)
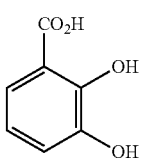
(3-2)
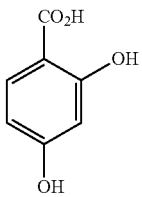
(3-3)
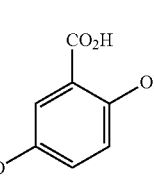
(3-4)
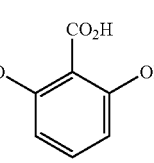
(3-5)
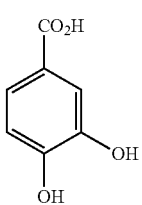

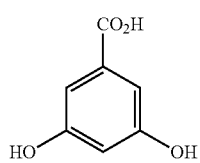 (3-6)
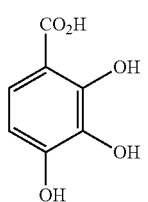 (3-7)
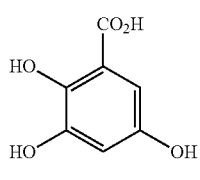 (3-8)
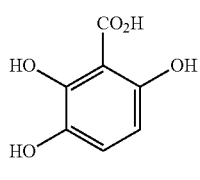 (3-9)
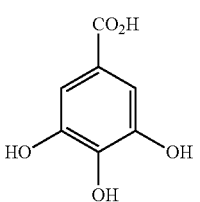 (3-10)
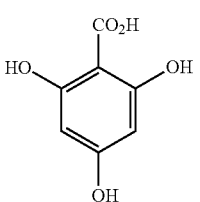 (3-11)
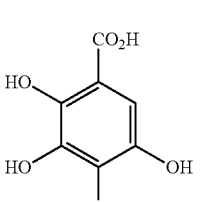 (3-12)
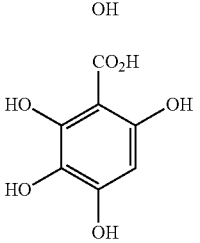 (3-13)
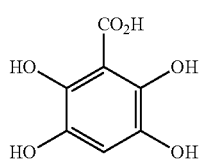 (3-14)
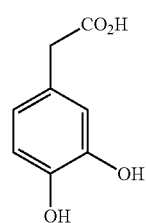 (3-15)
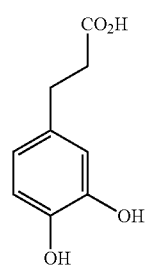 (3-16)
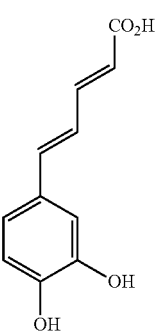 (3-17)
(3-18)
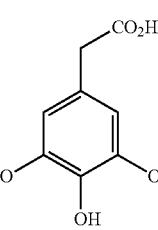 (3-19)

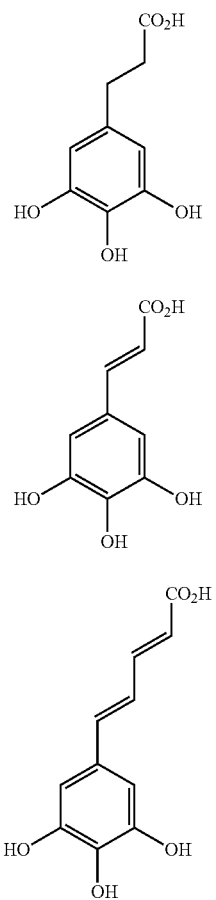

Examples of the compound of Formula (4) include compounds of the following Formulae (4-1) to (4-9).

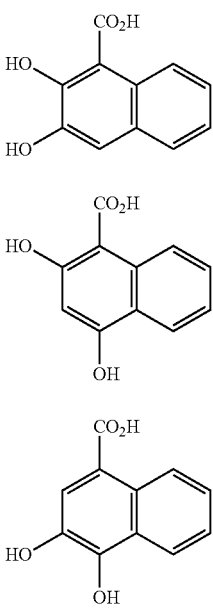

The resist underlayer film-forming composition of the present invention may contain a compound of Formula (2), (3), or (4) in an amount of, for example, 0.01 parts by mass to 60 parts by mass, preferably 0.1 parts by mass to 20 parts by mass relative to 100 parts by mass of the aforementioned resin.

When the resist underlayer film-forming composition of the present invention contains a compound of Formula (2), (3), or (4), a resist underlayer film formed from the composition can exhibit high resistance to an aqueous hydrogen peroxide solution. Thus, a resist underlayer film formed from the resist underlayer film-forming composition of the present invention can be used as a mask in etching and washing processes using an aqueous hydrogen peroxide solution.

The resist underlayer film-forming composition of the present invention may contain, as an optional component, a surfactant for improving the applicability of the composition to a substrate. Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylaryl ethers, such as polyoxyethylene octylphenyl ether and polyoxyethylene nonylphenyl ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP [registered trademark] EF301, EF303, and EF352 (available from Mitsubishi Materials Electronic Chemicals Co., Ltd.), MEGAFAC [registered trademark] F171, F173, R-30, R-30N, and R-40-LM (available from DIC Corporation), Fluorad FC430 and FC431 (available from 3M Japan Limited), Asahi Guard [registered trademark] AG710, and SURFLON [registered trademark] S-382, SC101, SC102, SC103, SC104, SC105, and SC106 (available from AGC Inc.); and Organosiloxane Polymer KP341 (available from Shin-Etsu Chemical Co., Ltd.). These surfactants may be added alone or in combination of two or more species.

When any of the aforementioned surfactants is used, the amount of the surfactant is, for example, 0.01 parts by mass to 5 parts by mass, preferably 0.1 parts by mass to 3 parts by mass relative to 100 parts by mass of the aforementioned resin.

The resist underlayer film-forming composition of the present invention can be prepared by dissolving the aforementioned components in an appropriate solvent, and is used in the form of a homogeneous solution. Examples of the usable solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbunanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. These solvents may be used alone or in combination of two or more species. Furthermore, such a solvent may be mixed with a high boiling point solvent such as propylene glycol monobutyl ether or propylene glycol monobutyl ether acetate.

The thus-prepared composition is preferably used after filtration with, for example, a filter having a pore size of, for example, 0.2 μm, 0.1 μm, or 0.05 μm. The resist underlayer film-forming composition of the present invention exhibits superior storage stability at room temperature for a long period of time.

EXAMPLES

The resist underlayer film-forming composition of the present invention will next be described in detail by way of the following examples, which should not be construed as limiting the invention thereto.

The following apparatus, etc. were used for measurement of the weight average molecular weights of reaction products prepared in Synthesis Examples described below.
Apparatus: HLC-8320GPC available from TOSOH CORPORATION
GPC column: TSKgel Super-Multipore HZ-N (two columns)
Column temperature: 40° C.
Flow rate: 0.35 ml/min
Eluent: tetrahydrofuran
Standard sample: polystyrene Synthesis Example 1

To 65.05 g of propylene glycol monomethyl ether (hereinafter abbreviated as "PGME") were added 10.00 g of 1,6-bis(2,3-epoxypropan-1-yloxy)naphthalene (trade name: HP-4032D, available from DIC Corporation), 7.72 g of 1,8-octanedicarboxylic acid, and 0.54 g of ethyltriphenylphosphonium bromide serving as a catalyst, and then reaction was allowed to proceed at 140° C. for 24 hours, to thereby prepare a solution containing a reaction product. The resultant reaction product was subjected to GPC analysis, and the product was found to have a weight average molecular weight of 4,400 in terms of standard polystyrene. The reaction product is assumed to be a copolymer having repeating structural units of the following Formula (1a).

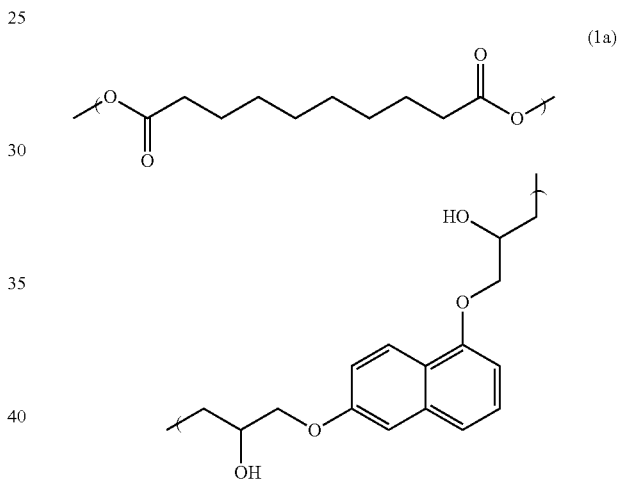

(1a)

Synthesis Example 2

To 65.57 g of PGME were added 8.00 g of trade name: RE303S-L (available from Nippon Kayaku Co., Ltd.) serving as a diepoxy compound, 7.94 g of 1,8-octanedicarboxylic acid, and 0.46 g of ethyltriphenylphosphonium bromide serving as a catalyst, and then reaction was allowed to proceed at 140° C. for 24 hours, to thereby prepare a solution containing a reaction product. The resultant reaction product was subjected to GPC analysis, and the product was found to have a weight average molecular weight of 4,500 in terms of standard polystyrene. The reaction product is assumed to be a copolymer having repeating structural units of the following Formula (1b).

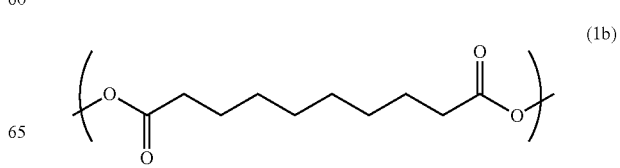

(1b)

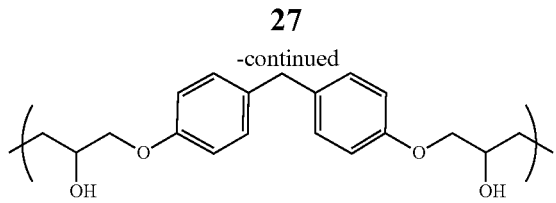

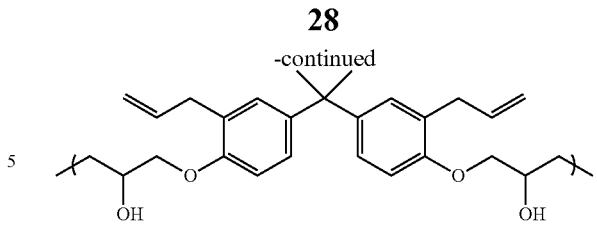

Synthesis Example 3

To 65.35 g of PGME were added 9.00 g of trade name: YX4000 (available from Mitsubishi Chemical Corporation) serving as a diepoxy compound, 6.89 g of 1,8-octanedicarboxylic acid, and 0.45 g of ethyltriphenylphosphonium bromide serving as a catalyst, and then reaction was allowed to proceed at 140° C. for 24 hours, to thereby prepare a solution containing a reaction product. The resultant reaction product was subjected to GPC analysis, and the product was found to have a weight average molecular weight of 5,600 in terms of standard polystyrene. The reaction product is assumed to be a copolymer having repeating structural units of the following Formula (1c).

Synthesis Example 5

To 65.15 g of PGME were added 10.00 g of trade name: RE810-NM (available from Nippon Kayaku Co., Ltd.) serving as a diepoxy compound, 5.72 g of 1,6-hexanedicarboxylic acid, 0.44 g of ethyltriphenylphosphonium bromide serving as a catalyst, and 0.13 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 5,900 in terms of standard polystyrene. The reaction product is assumed to be a copolymer having repeating structural units of the following Formula (1e).

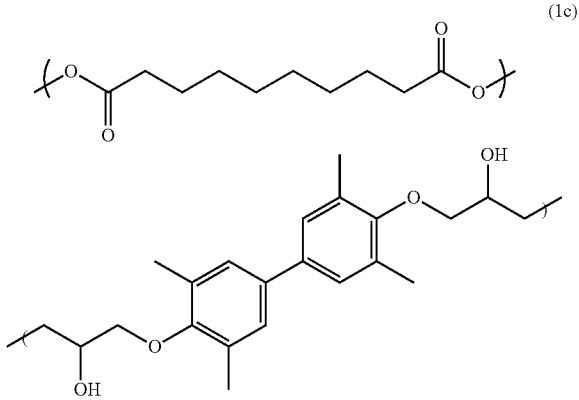

(1c)

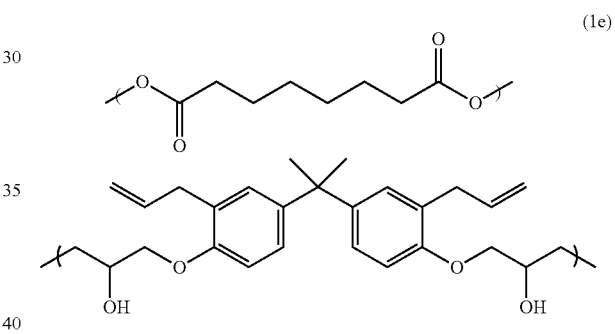

(1e)

Synthesis Example 4

To 123.90 g of PGME were added 18.00 g of trade name: RE810-NM (available from Nippon Kayaku Co., Ltd.) serving as a diepoxy compound, 11.96 g of 1,8-octanedicarboxylic acid, 0.78 g of ethyltriphenylphosphonium bromide serving as a catalyst, and 0.23 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 6,500 in terms of standard polystyrene. The reaction product is assumed to be a copolymer having repeating structural units of the following Formula (1d).

Synthesis Example 6

To 72.62 g of PGME were added 10.00 g of trade name: RE810-NM (available from Nippon Kayaku Co., Ltd.) serving as a diepoxy compound, 7.67 g of 1,10-dodecanedicarboxylic acid, 0.44 g of ethyltriphenylphosphonium bromide serving as a catalyst, and 0.13 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 5,400 in terms of standard polystyrene. The reaction product is assumed to be a copolymer having repeating structural units of the following Formula (1f).

(1d)

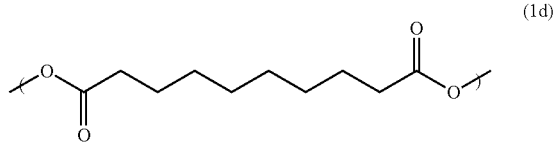

(1f)

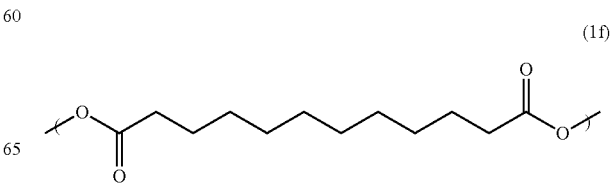

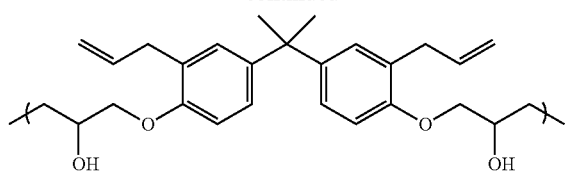

Synthesis Example 7

To 64.88 g of PGME were added 10.00 g of trade name: RE810-NM (available from Nippon Kayaku Co., Ltd.) serving as a diepoxy compound, 5.66 g of cis-1,4-cyclohexanedicarboxylic acid, 0.44 g of ethyltriphenylphosphonium bromide serving as a catalyst, and 0.13 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 5,400 in terms of standard polystyrene. The reaction product is assumed to be a copolymer having repeating structural units of the following Formula (1g).

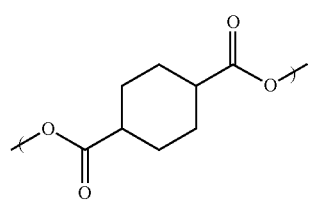
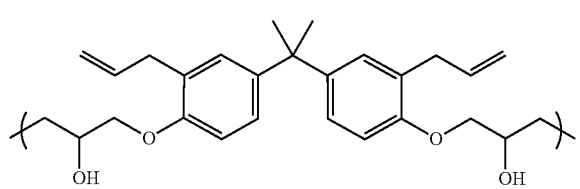
(1g)

Synthesis Example 8

To 40.51 g of PGME were added 6.00 g of trade name: RE810-NM (available from Nippon Kayaku Co., Ltd.) serving as a diepoxy compound, 3.79 g of 1,3-adamantanedicarboxylic acid, 0.26 g of ethyltriphenylphosphonium bromide serving as a catalyst, and 0.078 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 2,200 in terms of standard polystyrene. The reaction product is assumed to be a copolymer having repeating structural units of the following Formula (1h).

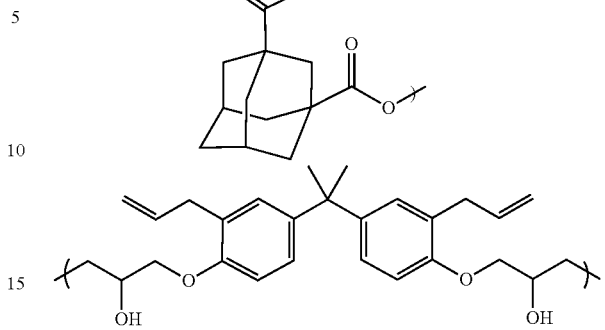
(1h)

Synthesis Example 9

To 36.25 g of PGME were added 6.00 g of trade name: RE810-NM (available from Nippon Kayaku Co., Ltd.) serving as a diepoxy compound, 2.72 g of 2,3-norbornanedicarboxylic acid, 0.26 g of ethyltriphenylphosphonium bromide serving as a catalyst, and 0.078 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 1,600 in terms of standard polystyrene. The reaction product is assumed to be a copolymer having repeating structural units of the following Formula (1i).

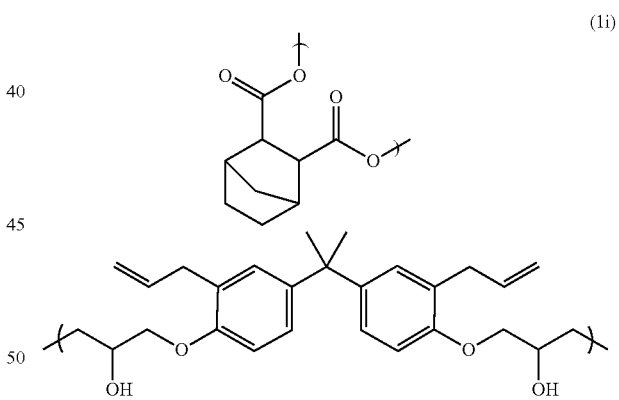
(1i)

Synthesis Example 10

To 72.88 g of PGME were added 10.00 g of monoallyl diglycidyl isocyanurate (trade name: MA-DGIC, available from SHIKOKU CHEMICALS CORPORATION), 7.89 g of 3,3'-dithiodipropionic acid (trade name: DTDPA, available from SC Organic Chemical Co., Ltd.), and 0.33 g of ethyltriphenylphosphonium bromide serving as a catalyst, and then reaction was allowed to proceed at 105° C. for 24 hours, to thereby prepare a solution containing a reaction product. The resultant reaction product was subjected to GPC analysis, and the product was found to have a weight average molecular weight of 5,300 in terms of standard polystyrene. The reaction product is assumed to be a copolymer having repeating structural units of the following Formula (1j).

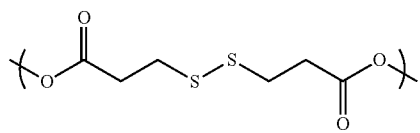

(1j)

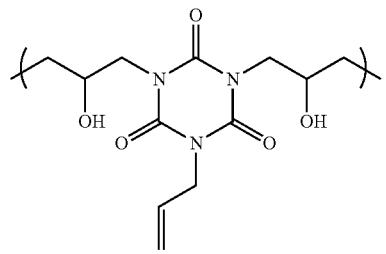

Synthesis Example 11

To 110.51 g of PGME were added 15.00 g of diglycidyl terephthalate (trade name: EX-711, available from Nagase ChemteX Corporation), 11.65 g of 3,3'-dithiodipropionic acid (trade name: DTDPA, available from SC Organic Chemical Co., Ltd.), and 0.98 g of ethyltriphenylphosphonium bromide serving as a catalyst, and then reaction was allowed to proceed at 105° C. for 24 hours, to thereby prepare a solution containing a reaction product. The resultant reaction product was subjected to GPC analysis, and the product was found to have a weight average molecular weight of 4,900 in terms of standard polystyrene. The reaction product is assumed to be a copolymer having repeating structural units of the following Formula (1k).

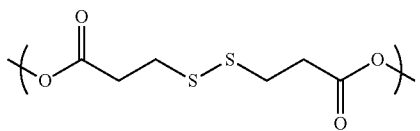

(1k)

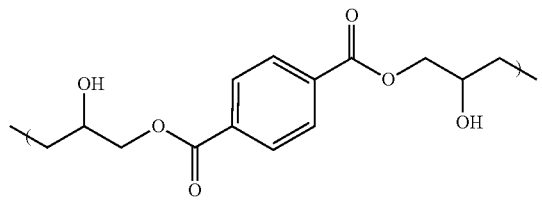

Synthesis Example 12

To 289.49 g of PGME were added 15.00 g of 1,6-bis(2,3-epoxypropan-1-yloxy)naphthalene (trade name: HP-4032D, available from DIC Corporation), 23.10 g of monoallyl diglycidyl isocyanurate (trade name: MA-DGIC, available from SHIKOKU CHEMICALS CORPORATION), 31.72 g of 3,3'-dithiodipropionic acid (trade name: DTDPA, available from SC Organic Chemical Co., Ltd.), and 2.55 g of ethyltriphenylphosphonium bromide serving as a catalyst, and then reaction was allowed to proceed at 105° C. for 24 hours, to thereby prepare a solution containing a reaction product. The resultant reaction product was subjected to GPC analysis, and the product was found to have a weight average molecular weight of 4,500 in terms of standard polystyrene. The reaction product is assumed to be a copolymer having repeating structural units of the following Formula (1n).

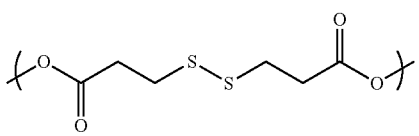

(1n)

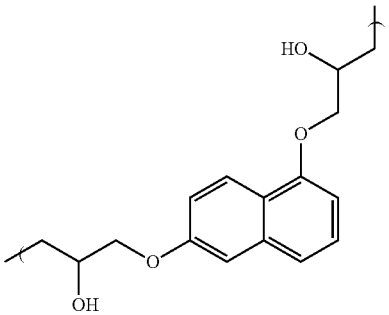

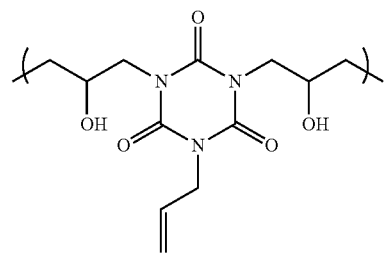

Synthesis Example 13

To 146.03 g of PGME were added 40.00 g of trade name: RE810-NM (available from Nippon Kayaku Co., Ltd.) serving as a diepoxy compound, 18.58 g of cis-1,2-cyclohexanedicarboxylic acid, 3.48 g of ethyltriphenylphosphonium bromide serving as a catalyst, and 0.52 g of hydroquinone serving as a radical trapping agent, and then reaction was allowed to proceed at 140° C. for 24 hours, to thereby prepare a solution containing a reaction product. The resultant reaction product was subjected to GPC analysis, and the product was found to have a weight average molecular weight of 2,200 in terms of standard polystyrene. The reaction product is assumed to be a copolymer having repeating structural units of the following Formula (1l).

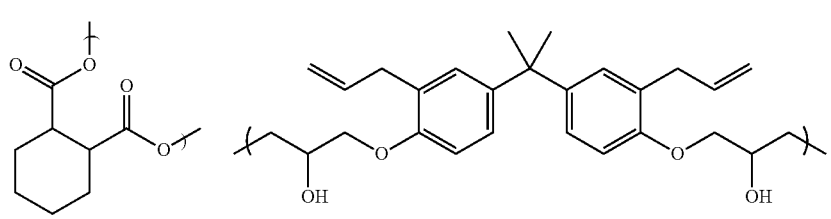

(1l)

Synthesis Example 14

To 148.30 g of PGME were added 40.00 g of trade name: YX4000 (available from Mitsubishi Chemical Corporation) serving as a diepoxy compound, 19.54 g of cis-1,2-cyclohexanedicarboxylic acid, and 4.01 g of ethyltriphenylphosphonium bromide serving as a catalyst, and then reaction was allowed to proceed at 140° C. for 24 hours, to thereby prepare a solution containing a reaction product. The resultant reaction product was subjected to GPC analysis, and the product was found to have a weight average molecular weight of 1,900 in terms of standard polystyrene. The reaction product is assumed to be a copolymer having repeating structural units of the following Formula (1m).

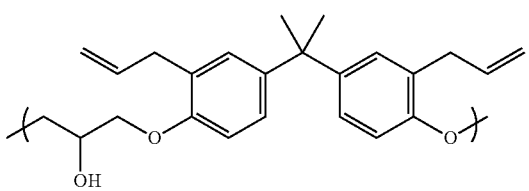

(1p)

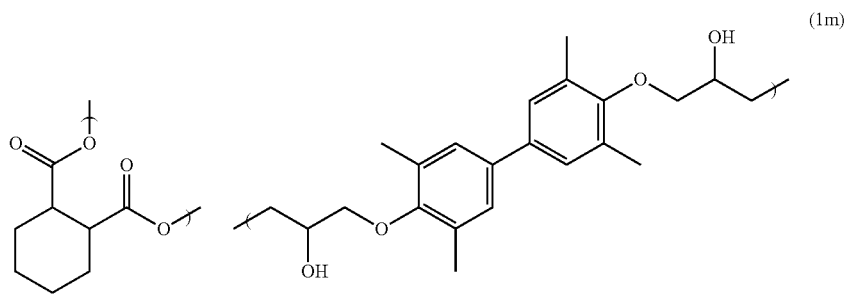

(1m)

Synthesis Example 15

To 57.97 g of PGME were added 20.00 g of trade name: RE810-NM (available from Nippon Kayaku Co., Ltd.) serving as a diepoxy compound, 16.65 g of 2,2-bis(3-allyl-4-hydroxyphenyl)propane (trade name: BPA-CA, available from Konishi Chemical Ind. Co., Ltd.), 1.74 g of ethyltriphenylphosphonium bromide serving as a catalyst, and 0.26 g of hydroquinone serving as a radical trapping agent, and then reaction was allowed to proceed at 140° C. for 24 hours, to thereby prepare a solution containing a reaction product. The resultant reaction product was subjected to GPC analysis, and the product was found to have a weight average molecular weight of 16,000 in terms of standard polystyrene. The reaction product is assumed to be a copolymer having a repeating structural unit of the following Formula (1p).

Synthesis Example 16

To 215.23 g of PGME were added 30.00 g of trade name: RE810-NM (available from Nippon Kayaku Co., Ltd.) serving as a diepoxy compound, 22.16 g of 1,8-octanedicarboxylic acid, 1.27 g of ethyltriphenylphosphonium bromide serving as a catalyst, and 0.38 g of hydroquinone serving as a radical trapping agent, and then reaction was allowed to proceed at 105° C. for 24 hours, to thereby prepare a solution containing a reaction product. The resultant reaction product was subjected to GPC analysis, and the product was found to have a weight average molecular weight of 5,000 in terms of standard polystyrene. The reaction product is assumed to be a copolymer having repeating structural units of the following Formula (1o).

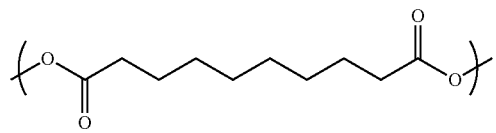

(1o)

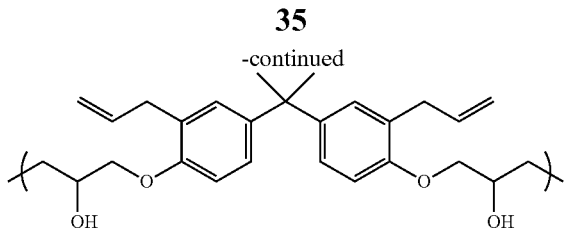

[Preparation of Resist Underlayer Film-Forming Composition]

Example 1

To 3.69 g of the solution containing 0.56 g of the copolymer prepared in Synthesis Example 1 (solvent: PGME used for the synthesis) were added 3.46 g of PGME, 2.83 g of propylene glycol monomethyl ether acetate (hereinafter abbreviated as "PGMEA"), 0.021 g of pyridinium trifluoromethanesulfonate (available from Tokyo Chemical Industry Co., Ltd.), and 0.0006 g of a surfactant (trade name: R-30N, available from DIC Corporation). These materials were mixed together to thereby prepare a 5.8% by mass solution. The solution was filtered with a polytetrafluoroethylene-made micro filter having a pore size of 0.2 μm, to thereby prepare a resist underlayer film-forming composition.

Example 2

To 3.79 g of the solution containing 0.56 g of the copolymer prepared in Synthesis Example 2 (solvent: PGME used for the synthesis) were added 3.37 g of PGME, 2.83 g of PGMEA, 0.021 g of pyridinium trifluoromethanesulfonate (available from Tokyo Chemical Industry Co., Ltd.), and 0.0006 g of a surfactant (trade name: R-30N, available from DIC Corporation). These materials were mixed together to thereby prepare a 5.8% by mass solution. The solution was filtered with a polytetrafluoroethylene-made micro filter having a pore size of 0.2 μm, to thereby prepare a resist underlayer film-forming composition.

Example 3

To 3.63 g of the solution containing 0.56 g of the copolymer prepared in Synthesis Example 3 (solvent: PGME used for the synthesis) were added 3.52 g of PGME, 2.83 g of PGMEA, 0.021 g of pyridinium trifluoromethanesulfonate (available from Tokyo Chemical Industry Co., Ltd.), and 0.0006 g of a surfactant (trade name: R-30N, available from DIC Corporation). These materials were mixed together to thereby prepare a 5.8% by mass solution. The solution was filtered with a polytetrafluoroethylene-made micro filter having a pore size of 0.2 μm, to thereby prepare a resist underlayer film-forming composition.

Example 4

To 126.18 g of the solution containing 20.66 g of the copolymer prepared in Synthesis Example 4 (solvent: PGME used for the synthesis) were added 110.47 g of PGME, 110.47 g of PGMEA, 0.77 g of pyridinium trifluoromethanesulfonate (available from Tokyo Chemical Industry Co., Ltd.), and 0.021 g of a surfactant (trade name: R-30N, available from DIC Corporation). These materials were mixed together to thereby prepare a 6.5% by mass solution. The solution was filtered with a polytetrafluoroethylene-made micro filter having a pore size of 0.2 μm, to thereby prepare a resist underlayer film-forming composition.

Example 5

To 6.33 g of the solution containing 1.08 g of the copolymer prepared in Synthesis Example 5 (solvent: PGME used for the synthesis) were added 7.97 g of PGME, 5.66 g of PGMEA, 0.040 g of pyridinium trifluoromethanesulfonate (available from Tokyo Chemical Industry Co., Ltd.), and 0.0011 g of a surfactant (trade name: R-30N, available from DIC Corporation). These materials were mixed together to thereby prepare a 5.6% by mass solution. The solution was filtered with a polytetrafluoroethylene-made micro filter having a pore size of 0.2 μm, to thereby prepare a resist underlayer film-forming composition.

Example 6

To 6.59 g of the solution containing 1.08 g of the copolymer prepared in Synthesis Example 6 (solvent: PGME used for the synthesis) were added 7.71 g of PGME, 5.66 g of PGMEA, 0.040 g of pyridinium trifluoromethanesulfonate (available from Tokyo Chemical Industry Co., Ltd.), and 0.0011 g of a surfactant (trade name: R-30N, available from DIC Corporation). These materials were mixed together to thereby prepare a 5.6% by mass solution. The solution was filtered with a polytetrafluoroethylene-made micro filter having a pore size of 0.2 μm, to thereby prepare a resist underlayer film-forming composition.

Example 7

To 8.78 g of the solution containing 1.44 g of the copolymer prepared in Synthesis Example 7 (solvent: PGME used for the synthesis) were added 9.12 g of PGME, 7.05 g of PGMEA, 0.054 g of pyridinium trifluoromethanesulfonate (available from Tokyo Chemical Industry Co., Ltd.), and 0.0014 g of a surfactant (trade name: R-30N, available from DIC Corporation). These materials were mixed together to thereby prepare a 6.0% by mass solution. The solution was filtered with a polytetrafluoroethylene-made micro filter having a pore size of 0.2 μm, to thereby prepare a resist underlayer film-forming composition.

Example 8

To 8.61 g of the solution containing 1.44 g of the copolymer prepared in Synthesis Example 8 (solvent: PGME used for the synthesis) were added 9.28 g of PGME, 7.05 g of PGMEA, 0.054 g of pyridinium trifluoromethanesulfonate (available from Tokyo Chemical Industry Co., Ltd.), and 0.0014 g of a surfactant (trade name: R-30N, available from DIC Corporation). These materials were mixed together to thereby prepare a 6.0% by mass solution. The solution was filtered with a polytetrafluoroethylene-made micro filter having a pore size of 0.2 μm, to thereby prepare a resist underlayer film-forming composition.

Example 9

To 7.84 g of the solution containing 1.44 g of the copolymer prepared in Synthesis Example 9 (solvent: PGME used for the synthesis) were added 10.06 g of PGME, 7.05 g of PGMEA, 0.054 g of pyridinium trifluoromethanesulfonate (available from Tokyo Chemical Industry Co., Ltd.), and 0.0014 g of a surfactant (trade name: R-30N, available from DIC Corporation). These materials were mixed together to thereby prepare a 6.0% by mass solution. The solution was filtered with a polytetrafluoroethylene-made micro filter having a pore size of 0.2 μm, to thereby prepare a resist underlayer film-forming composition.

Example 10

To 3.74 g of the solution containing 0.64 g of the copolymer prepared in Synthesis Example 10 (solvent: PGME used for the synthesis) were added 3.44 g of PGME, 2.80 g of PGMEA, 0.024 g of pyridinium trifluoromethanesulfonate (available from Tokyo Chemical Industry Co., Ltd.), and 0.00064 g of a surfactant (trade name: R-30N, available from DIC Corporation). These materials were mixed together to thereby prepare a 6.6% by mass solution. The solution was filtered with a polytetrafluoroethylene-made micro filter having a pore size of 0.2 μm, to thereby prepare a resist underlayer film-forming composition.

Example 11

To 4.06 g of the solution containing 0.64 g of the copolymer prepared in Synthesis Example 11 (solvent: PGME used for the synthesis) were added 3.11 g of PGME, 2.80 g of PGMEA, 0.024 g of pyridinium trifluoromethanesulfonate (available from Tokyo Chemical Industry Co., Ltd.), and 0.00064 g of a surfactant (trade name: R-30N, available from DIC Corporation). These materials were mixed together to thereby prepare a 6.6% by mass solution. The solution was filtered with a polytetrafluoroethylene-made micro filter having a pore size of 0.2 μm, to thereby prepare a resist underlayer film-forming composition.

Example 12

To 3.66 g of the solution containing 0.61 g of the copolymer prepared in Synthesis Example 12 (solvent: PGME used for the synthesis) were added 6.29 g of PGME, 0.023 g of pyridinium trifluoromethanesulfonate (available from Tokyo Chemical Industry Co., Ltd.), 0.030 g of gallic acid hydrate (available from Tokyo Chemical Industry Co., Ltd.), and 0.00061 g of a surfactant (trade name: R-30N, available from DIC Corporation). These materials were mixed together to thereby prepare a 6.6% by mass solution. The solution was filtered with a polytetrafluoroethylene-made micro filter having a pore size of 0.2 μm, to thereby prepare a resist underlayer film-forming composition.

Example 13

To 3.34 g of the solution containing 0.86 g of the copolymer prepared in Synthesis Example 13 (solvent: PGME used for the synthesis) were added 7.39 g of PGME, 4.24 g of PGMEA, 0.024 g of pyridinium trifluoromethanesulfonate (available from Tokyo Chemical Industry Co., Ltd.), and 0.00086 g of a surfactant (trade name: R-30N, available from DIC Corporation). These materials were mixed together to thereby prepare a 5.9% by mass solution. The solution was filtered with a polytetrafluoroethylene-made micro filter having a pore size of 0.2 μm, to thereby prepare a resist underlayer film-forming composition.

Example 14

To 3.26 g of the solution containing 0.86 g of the copolymer prepared in Synthesis Example 14 (solvent: PGME used for the synthesis) were added 7.48 g of PGME, 4.23 g of PGMEA, 0.024 g of pyridinium trifluoromethanesulfonate (available from Tokyo Chemical Industry Co., Ltd.), and 0.00086 g of a surfactant (trade name: R-30N, available from DIC Corporation). These materials were mixed together to thereby prepare a 5.9% by mass solution. The solution was filtered with a polytetrafluoroethylene-made micro filter having a pore size of 0.2 μm, to thereby prepare a resist underlayer film-forming composition.

Example 15

To 3.77 g of the solution containing 0.60 g of the copolymer prepared in Synthesis Example 10 (solvent: PGME used for the synthesis) were added 6.21 g of PGME, 0.022 g of 5-sulfosalicylic acid (available from Tokyo Chemical Industry Co., Ltd.), and 0.00060 g of a surfactant (trade name: R-30N, available from DIC Corporation). These materials were mixed together to thereby prepare a 6.2% by mass solution. The solution was filtered with a polytetrafluoroethylene-made micro filter having a pore size of 0.2 μm, to thereby prepare a resist underlayer film-forming composition.

Example 16

To 36.15 g of the solution containing 5.38 g of the copolymer prepared in Synthesis Example 16 (solvent: PGME used for the synthesis) were added 35.31 g of PGME, 28.32 g of PGMEA, 0.22 g of pyridinium trifluoromethanesulfonate (available from Tokyo Chemical Industry Co., Ltd.), and 0.0054 g of a surfactant (trade name: R-30N, available from DIC Corporation). These materials were mixed together to thereby prepare a 5.6% by mass solution. The solution was filtered with a polytetrafluoroethylene-made micro filter having a pore size of 0.2 μm, to thereby prepare a resist underlayer film-forming composition.

Comparative Example 1

To 2.63 g of the solution containing 0.50 g of the copolymer prepared in Synthesis Example 4 (solvent: PGME used for the synthesis) were added 2.50 g of PGME, 2.81 g of PGMEA, 0.13 g of tetramethoxymethyl glycoluril (trade name: POWDERLINK 1174, available from Cytec Industries Japan) serving as a crosslinking agent in the form of a monomer, 0.019 g of pyridinium trifluoromethanesulfonate (available from Tokyo Chemical Industry Co., Ltd.), and 0.0005 g of a surfactant (trade name: R-30N, available from DIC Corporation). These materials were mixed together to thereby prepare a 6.5% by mass solution. The solution was filtered with a polytetrafluoroethylene-made micro filter having a pore size of 0.2 μm, to thereby prepare a resist underlayer film-forming composition. This Comparative Example corresponds to a case where the composition contains a crosslinking agent in the form of a monomer.

Comparative Example 2

To 3.19 g of the solution containing 0.54 g of the copolymer prepared in Synthesis Example 10 (solvent: PGME used for the synthesis) were added 3.86 g of PGME, 2.79 g of PGMEA, 0.14 g of tetramethoxymethyl glycoluril (trade name: POWDERLINK 1174, available from Cytec Industries Japan) serving as a crosslinking agent in the form of a monomer, 0.020 g of pyridinium trifluoromethanesulfonate (available from Tokyo Chemical Industry Co., Ltd.), and 0.0005 g of a surfactant (trade name: R-30N, available from DIC Corporation). These materials were mixed together to thereby prepare a 7.0% by mass solution. The solution was filtered with a polytetrafluoroethylene-made micro filter having a pore size of 0.2 μm, to thereby prepare a resist underlayer film-forming composition. This Comparative Example corresponds to a case where the composition contains a crosslinking agent in the form of a monomer.

Comparative Example 3

To 2.31 g of the solution containing 0.28 g of the copolymer prepared in Synthesis Example 15 (solvent: PGME used for the synthesis) were added 1.27 g of PGME, 1.41 g of PGMEA, 0.011 g of pyridinium trifluoromethanesulfonate (available from Tokyo Chemical Industry Co., Ltd.), and 0.0003 g of a surfactant (trade name: R-30N, available from DIC Corporation). These materials were mixed together to thereby prepare a 5.8% by mass solution. The solution was filtered with a polytetrafluoroethylene-made micro filter having a pore size of 0.2 μm, to thereby prepare a resist underlayer film-forming composition. This Comparative Example corresponds to a case where the copolymer does not contain a —C(=O)—O— group.

Comparative Example 4

To 3.65 g of the solution containing 0.58 g of the copolymer prepared in Synthesis Example 10 (solvent: PGME used for the synthesis) were added 6.33 g of PGME, 0.022 g of trifluoroacetic acid (available from Tokyo Chemical Industry Co., Ltd.), and 0.00058 g of a surfactant (trade name: R-30N, available from DIC Corporation). These materials were mixed together to thereby prepare a 6.0% by mass solution. The solution was filtered with a polytetrafluoroethylene-made micro filter having a pore size of 0.2 μm, to thereby prepare a resist underlayer film-forming composition. This Comparative Example corresponds to a case where the used acid catalyst exhibits a pKa of more than −0.5.

[Test for Elution in Photoresist Solvent]

Each of the resist underlayer film-forming compositions prepared in Examples 1 to 16 and Comparative Examples 1 to 4 was applied onto a silicon wafer with a spinner. Thereafter, the composition was baked on a hot plate at a temperature shown in Table 1 below for one minute, to thereby form a resist underlayer film (thickness: 0.2 μm). The resist underlayer film was immersed in solvents used for a photoresist solution; i.e., PGME and PGMEA. Table 1 shows the results of evaluation of solvent resistance; specifically, "0" in the case of insoluble in both these solvents, and "x" in the case of soluble in both these solvents.

[Test for Optical Parameters]

Each of the resist underlayer film-forming compositions prepared in Examples 1 to 16 and Comparative Examples 1 to 4 was applied onto a silicon wafer with a spinner. Thereafter, the composition was baked on a hot plate at a temperature shown in Table 1 below for one minute, to thereby form a resist underlayer film (thickness: 0.2 μm). Subsequently, the refractive index (n value) and attenuation coefficient (k value) of the resist underlayer film were measured at wavelengths of 193 nm and 248 nm with an optical ellipsometer (VUV-VASE VU-302, available from J. A. Woollam). The results are shown in Table 1 below. The k value at a wavelength of 193 nm is preferably 0.1 or more such that the resist underlayer film has a sufficient anti-reflective function.

TABLE 1

| | Baking temperature (deg. C.) | Solvent resistance | | Optical parameters 193 nm | | Planarity |
|---|---|---|---|---|---|---|
| | | PGME | PGMEA | n value | k value | |
| Example 1 | 215 | O | O | 1.58 | 0.10 | O |
| Example 2 | 215 | O | O | 1.55 | 0.48 | O |
| Example 3 | 215 | O | O | 1.56 | 0.16 | O |
| Example 4 | 215 | O | O | 1.53 | 0.36 | O |
| Example 5 | 215 | O | O | 1.53 | 0.36 | O |
| Example 6 | 215 | O | O | 1.56 | 0.35 | O |
| Example 7 | 215 | O | O | 1.54 | 0.37 | O |
| Example 8 | 215 | O | O | 1.57 | 0.35 | O |
| Example 9 | 215 | O | O | 1.55 | 0.34 | O |
| Example 10 | 215 | O | O | 1.96 | 0.29 | O |
| Example 11 | 215 | O | O | 1.69 | 0.35 | O |
| Example 12 | 250 | O | O | 1.85 | 0.24 | O |
| Example 13 | 215 | O | O | 1.53 | 0.37 | O |
| Example 14 | 215 | O | O | 1.56 | 0.16 | O |
| Example 15 | 250 | O | O | 1.94 | 0.28 | O |
| Example 16 | 215 | O | O | 1.54 | 0.34 | O |
| Comparative Example 1 | 215 | O | O | 1.58 | 0.31 | X |
| Comparative Example 2 | 215 | O | O | 1.96 | 0.26 | X |
| Comparative Example 3 | 215 | X | X | 1.46 | 0.53 | — |
| Comparative Example 4 | 250 | X | X | 1.94 | 0.28 | — |

[Test for Coating of Stepped Substrate]

For evaluation of planarity, the thicknesses of portions of a coating film were compared on an $SiO_2$ substrate having a thickness of 230 nm and having a trench area (TRENCH) (trench width: 200 nm, pitch: 600 nm) and a non-patterned open area (OPEN). Each of the resist underlayer film-forming compositions of Examples 1 to 16 and Comparative Examples 1 and 2 was applied onto the aforementioned substrate so as to achieve a coating thickness of 200 nm, and then baked on a hot plate at a temperature shown in Table 1 above for one minute, to thereby form a resist underlayer film (thickness: 0.2 μm). For evaluation of coating of the stepped substrate (planarity), the substrate was observed with a scanning electron microscope (S-4800) available from Hitachi High-Technologies Corporation, followed by measurement of the difference between the thickness of the substrate at the trench area (patterned area) and that at the open area (non-patterned area) (i.e., the difference in coating level between the trench area and the open area, which is called "Bias"). Table 2 shows the thicknesses of the trench area and the open area and the difference in coating level. The difference in coating level can be used for evaluation of the planarity; i.e., the smaller the difference in coating level, the higher the planarity. Table 1 shows the results of evaluation of planarity; specifically, "O" in the case of a difference in coating level of less than 40 nm, and "x" in the case of a difference in coating level of 40 nm or more (see Table 2 below).

TABLE 2

| | TRENCH Thickness (nm) | OPEN Thickness (nm) | TRENCH/OPEN Difference in coating level (nm) |
|---|---|---|---|
| Example 1 | 173 | 185 | 12 |
| Example 2 | 167 | 185 | 18 |
| Example 3 | 159 | 175 | 16 |
| Example 4 | 171 | 183 | 12 |
| Example 5 | 145 | 177 | 32 |
| Example 6 | 173 | 181 | 8 |
| Example 7 | 165 | 185 | 21 |
| Example 8 | 153 | 192 | 39 |
| Example 9 | 157 | 161 | 4 |
| Example 10 | 159 | 193 | 34 |
| Example 11 | 161 | 179 | 18 |
| Example 12 | 157 | 187 | 30 |
| Example 13 | 183 | 189 | 6 |
| Example 14 | 189 | 189 | 0 |
| Example 15 | 175 | 185 | 10 |
| Example 16 | 169 | 201 | 32 |
| Comparative Example 1 | 153 | 199 | 46 |
| Comparative Example 2 | 149 | 195 | 46 |

The results of comparison of planarity show that the difference in coating level between the trench area and the open area in Examples 1 to 16 is smaller than that in Comparative Examples 1 and 2. Thus, the resist underlayer film formed from each of the resist underlayer film-forming compositions of Examples 1 to 16 exhibits good planarity.

INDUSTRIAL APPLICABILITY

The resist underlayer film-forming composition of the present invention exhibits high reflow property after being applied to a substrate and then baked. Thus, the composition can be evenly applied onto a stepped substrate to thereby form a flat film. The composition is useful for forming a resist underlayer film since it has an appropriate anti-reflective effect.

The invention claimed is:

1. A composition comprising:
a resin having
a first repeating structural unit including —C(=O)—O— group and
a second repeating structural unit including hydroxy group derived from epoxy group,
wherein none of these repeating structural units have an organic group containing an epoxy ring or an oxetane ring,
wherein the first repeating structural unit is obtained by polymerizing at least one monomer selected from the group consisting of:

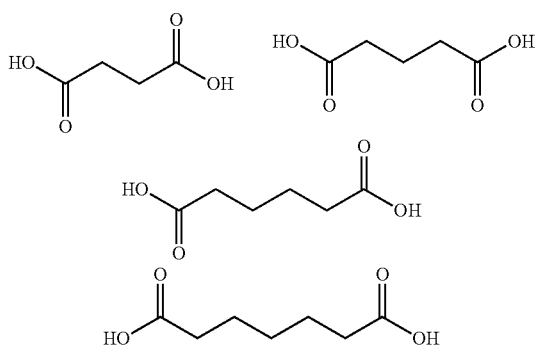

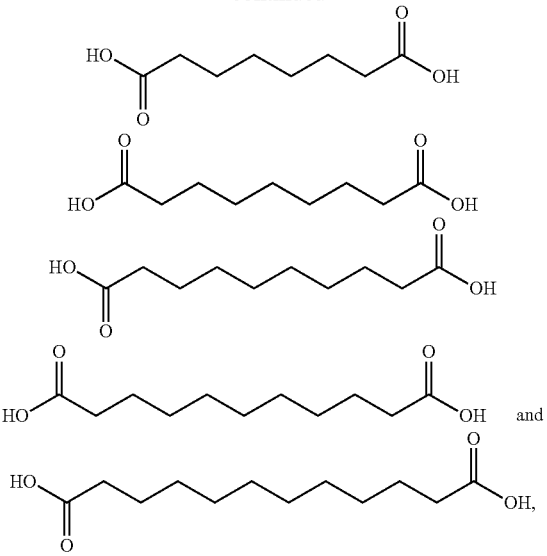

wherein the second repeating structural unit has the following Formula (1-2):

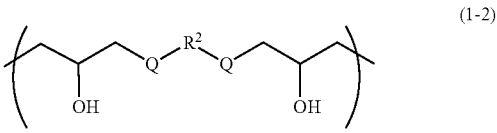

(1-2)

wherein $R^2$ is a divalent organic group containing a linear, branched, or cyclic functional group having a carbon atom number of 2 to 20, the organic group optionally has at least one sulfur atom or oxygen atom, and the two Qs are each a single bond, an —O— group, or a —C(=O)—O— group;
an acid catalyst or a salt thereof in an amount of 0.1 parts by mass to 10 parts by mass relative to 100 parts by mass of the resin, wherein the acid catalyst is selected from among a sulfonic acid having an acid dissociation constant pKa of −0.5 or less in water at 25° C. and a multivalent acid having an acid dissociation constant pKa of −0.5 or less in water at 25° C.; and
a solvent,
wherein the composition does not comprise a crosslinking agent in the form of a monomer.

2. The composition according to claim 1, wherein the salt of the acid catalyst is a trifluoromethanesulfonic acid salt.

3. The composition according to claim 2, wherein the cationic component of the trifluoromethanesulfonic acid salt is a primary to quaternary ammonium ion, a pyridinium ion optionally having a substituent, an imidazolium ion optionally having a substituent, an iodonium ion optionally having a substituent, a sulfonium ion optionally having a substituent, or a pyrylium ion optionally having a substituent.

4. The composition according to claim 1, wherein, in the repeating structural unit of Formula (1-2), $R^2$ is a divalent linear, branched, or cyclic hydrocarbon group having a carbon atom number of 2 to 20, or a divalent organic group containing at least one $C_{6-20}$ aromatic ring or $C_{3-12}$ heterocyclic ring, and the heterocyclic ring has at least one sulfur atom or oxygen atom.

5. The composition according to claim 1, wherein the composition further comprises a compound of the following Formula (2), (3), or (4):

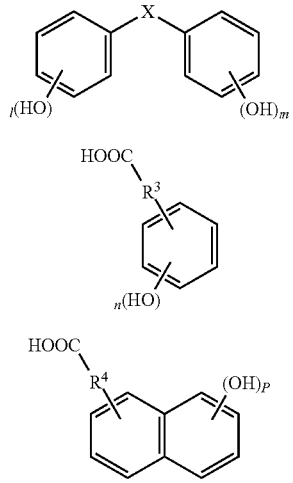

where X is a carbonyl or methylene group; l and m are each independently an integer of 0 to 5 so as to satisfy a relation of 3≤l+m≤10; $R^3$ and $R^4$ are each independently a $C_{1-4}$ alkylene or alkenylene group or a single bond; n and p are each independently an integer of 2 to 4; and each substituent in Formula (4) is located at any of positions 1 to 8 of a naphthalene ring.

6. The composition according to claim 1, wherein the composition further comprises a surfactant.

7. A composition comprising:

a resin having
  a first repeating structural unit including —C(=O)—O— group and
  a second repeating structural unit including hydroxy group derived from epoxy group,
  wherein none of these repeating structural units have an organic group containing an epoxy ring or an oxetane ring,
  wherein the first repeating structural unit is obtained by polymerizing at least one monomer selected from the group consisting of:

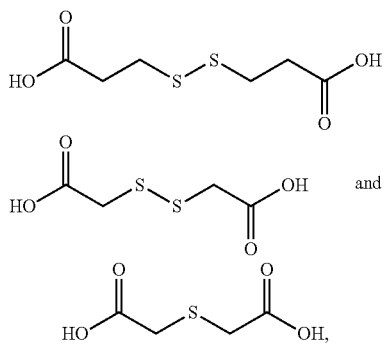

wherein the second repeating structural unit has the following Formula (1-2):

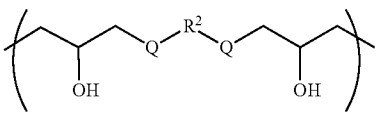

wherein $R^2$ is a divalent organic group containing a linear, branched, or cyclic functional group having a carbon atom number of 2 to 20, the organic group optionally has at least one sulfur atom or oxygen atom, and the two Qs are each a single bond, an —O— group, or a —C(=O)—O— group;

an acid catalyst or a salt thereof in an amount of 0.1 parts by mass to 10 parts by mass relative to 100 parts by mass of the resin, wherein the acid catalyst is selected from among a sulfonic acid having an acid dissociation constant pKa of −0.5 or less in water at 25° C. and a multivalent acid having an acid dissociation constant $pKa_1$ of −0.5 or less in water at 25° C.; and a solvent, wherein the composition does not comprise a crosslinking agent in the form of a monomer.

8. A composition comprising:

a resin having
  a first repeating structural unit including —C(=O)—O— group and
  a second repeating structural unit including hydroxy group derived from epoxy group,
  wherein none of these repeating structural units have an organic group containing an epoxy ring or an oxetane ring,
  wherein the first repeating structural unit is obtained by polymerizing:

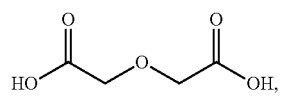

wherein the second repeating structural unit has the following Formula (1-2):

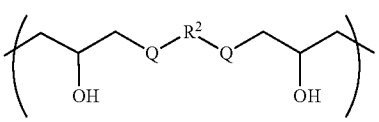

wherein $R^2$ is a divalent organic group containing a linear, branched, or cyclic functional group having a carbon atom number of 2 to 20, the organic group optionally has at least one sulfur atom or oxygen atom, and the two Qs are each a single bond, an —O— group, or a —C(=O)—O— group;

an acid catalyst or a salt thereof in an amount of 0.1 parts by mass to 10 parts by mass relative to 100 parts by mass of the resin, wherein the acid catalyst is selected from among a sulfonic acid having an acid dissociation constant pKa of −0.5 or less in water at 25° C. and a multivalent acid having an acid dissociation constant $pKa_1$ of −0.5 or less in water at 25° C.; and a solvent, wherein the composition does not comprise a crosslinking agent in the form of a monomer.

9. A composition comprising:

a resin having a first repeating structural unit including —C(=O)—O— group and a second repeating structural unit including hydroxy group derived from epoxy group, wherein none of these repeating structural units have an organic group containing an epoxy ring or an oxetane ring, and the first repeating structural unit is obtained by polymerizing at least one monomer selected from the group consisting of:

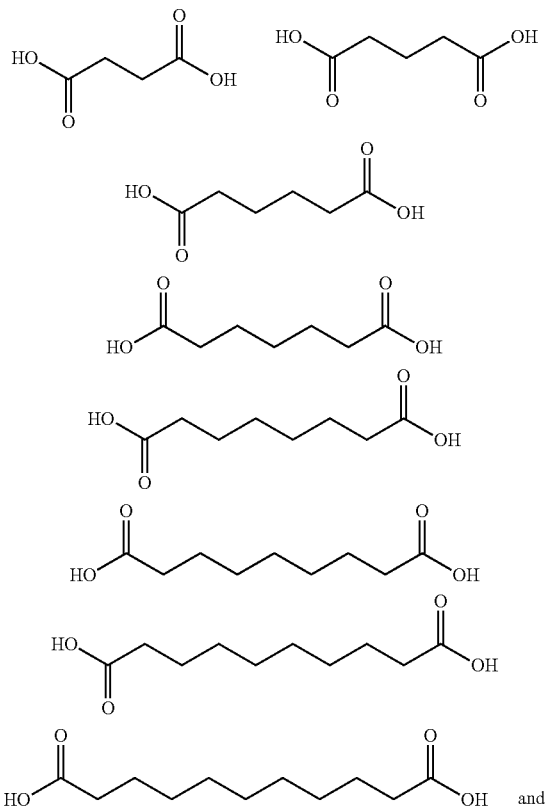

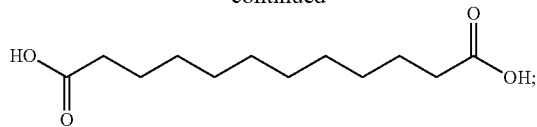

an acid catalyst or a salt thereof in an amount of 0.1 parts by mass to 10 parts by mass relative to 100 parts by mass of the resin, wherein the acid catalyst is selected from among a sulfonic acid having an acid dissociation constant pKa of −0.5 or less in water at 25° C. and a multivalent acid having an acid dissociation constant $pKa_1$ of −0.5 or less in water at 25° C.; and a solvent, wherein the composition does not comprise a crosslinking agent in the form of a monomer.

10. The composition according to claim 9, wherein the composition further comprises a compound of the following Formula (2), (3), or (4):

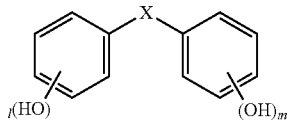

(2)

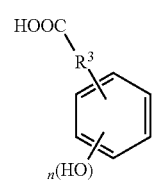

(3)

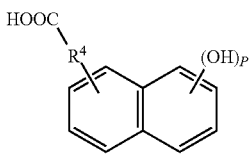

(4)

where X is a carbonyl or methylene group; l and m are each independently an integer of 0 to 5 so as to satisfy a relation of $3 \leq l+m \leq 10$; $R^3$ and $R^4$ are each independently a $C_{1-4}$ alkylene or alkenylene group or a single bond; n and p are each independently an integer of 2 to 4; and each substituent in Formula (4) is located at any of positions 1 to 8 of a naphthalene ring.

* * * * *